(12) United States Patent
Fujii et al.

(10) Patent No.: US 6,414,881 B1
(45) Date of Patent: Jul. 2, 2002

(54) SEMICONDUCTOR DEVICE CAPABLE OF GENERATING INTERNAL VOLTAGE EFFECTIVELY

(75) Inventors: Nobuyuki Fujii; Fukashi Morishita; Akira Yamazaki; Yasuhiko Taito; Mihoko Akiyama; Mako Kobayashi, all of Hyogo (JP)

(73) Assignees: Mitsubishi Denki Kabushiki Kaisha; Mitsubishi Electric Engineering Company Limited, both of Tokyo (JP)

(*) Notice: Subject to any disclaimer, the term of this patent is extended or adjusted under 35 U.S.C. 154(b) by 0 days.

(21) Appl. No.: 09/876,078

(22) Filed: Jun. 8, 2001

(30) Foreign Application Priority Data

Sep. 4, 2000 (JP) .................................... 2000-266986

(51) Int. Cl.[7] ................................................ G11C 7/00
(52) U.S. Cl. .................. 365/189.09; 365/226; 327/534; 327/536
(58) Field of Search ........................... 365/189.09, 226; 327/534, 536, 537

(56) References Cited

U.S. PATENT DOCUMENTS 5,034,625 A * 7/1991 Min et al. ................. 307/296.2
5,337,284 A * 8/1994 Cordoba et al. ............. 365/227
5,909,140 A * 6/1999 Choi ........................... 327/534
6,128,242 A * 10/2000 Banba et al. ................ 365/226

FOREIGN PATENT DOCUMENTS

| JP | 63-278266 | 11/1988 |
| JP | 4-318393 | 11/1992 |
| JP | 9-139078 | 5/1997 |
| JP | 9-201040 | 7/1997 |

* cited by examiner

*Primary Examiner*—Son Mai
(74) *Attorney, Agent, or Firm*—Burns, Doane, Swecker & Mathis, LLP

(57) ABSTRACT

In a control voltage generating section for supplying a control voltage to a gate of a charge transfer gate for transferring charges received from a capacitor to an output node to generate an internal voltage, the amplitude of the control voltage is switched in accordance with a switch signal. An internal voltage generating circuit making it possible to improve design efficiency, reliability and yield and reduce power consumption is provided.

20 Claims, 13 Drawing Sheets

F I G. 7
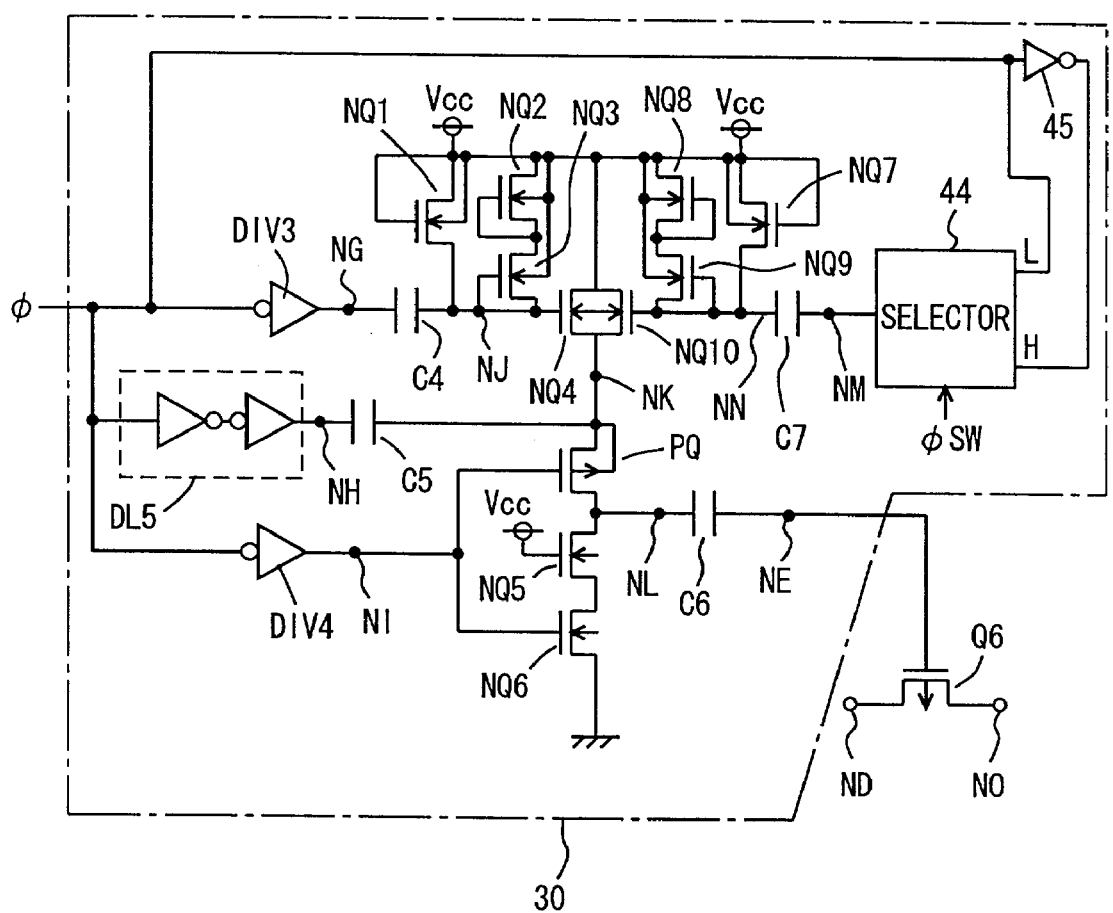

SEMICONDUCTOR DEVICE CAPABLE OF GENERATING INTERNAL VOLTAGE EFFECTIVELY

BACKGROUND OF THE INVENTION

1. Field of the Invention

The present invention relates to a semiconductor device, and in particular to a semiconductor device for generating internal voltage through pumping operation. Specifically, the present invention relates to a substrate bias voltage generating circuit for generating bias voltage to be applied to a substrate region.

2. Description of the Background Art

A semiconductor device is provided with an internal voltage generating circuit in order to reduce power consumption of a whole system and to generate a voltage at a desired level. Internal voltage is classified into a high voltage higher than an external power supply voltage, a reference voltage at a level between the ground voltage and the power supply voltage, a negative bias voltage applied to a substrate region of the semiconductor device, and so on. Particularly in a semiconductor memory device, a bias voltage VBB is applied to the substrate region in order to stabilize the threshold voltage of memory cell transistors composed of MOS transistors (insulated gate type field effect transistors) and to reduce the junction capacitance thereof.

FIG. 14 is a block diagram schematically showing a conventional bias voltage generating circuit. In FIG. 14, the bias voltage generating circuit includes an active bias voltage generating circuit activated in an active cycle 102 for generating the bias voltage VBB, a standby bias voltage generating circuit 104 for generating the bias voltage VBB in a standby cycle, and a level detecting circuit 100 for detecting whether or not the level of the bias voltage VBB reaches a predetermined voltage level to selectively activate, according to the detection result, the active bias voltage generating circuit 102 or the standby bias voltage generating circuit 104. This level detecting circuit 100 includes a level detector for the active cycles and a level detector for the standby cycles, which generate active activity control signal φAL and standby activity control signal φSL, respectively. The bias voltage VBB is a negative voltage. If this bias voltage VBB drops below a predetermined value, the level detecting circuit 100 stops the bias voltage generating operation of the bias voltage generating circuit(s) 102 and/or 104.

The active bias voltage generating circuit 102 has a large charge supply capability and prevents fluctuation in the level of the bias voltage VBB in the operation of an internal circuit in an active cycle. The standby bias voltage generating circuit 104 has a relatively small charge supply capability, and suppresses fluctuation in the bias voltage VBB due to a leakage current in a standby state.

The active bias voltage generating circuit 102 includes an active ring oscillator 102a that performs oscillation operation selectively, dependently on the activity control signal φAL from the level detecting circuit 100, and an active pumping circuit 102b that utilizes a charge pumping operation of a capacitor and supplies charges to an output node, dependently on an oscillation signal from the active ring oscillator 102a. When the activity control signal φAL is in an active state and instructs that the bias voltage VBB does not reach a predetermined voltage level, the active ring oscillator 102a performs oscillation operation. When the bias voltage VBB reaches the predetermined level, the oscillator 102a stops the oscillation operation.

The standby bias voltage generating circuit 104 includes a standby ring oscillator 104a that performs oscillation operation selectively, dependently on the activity control signal φSL from the level detecting circuit 100, and a standby pumping circuit 104b that performs a charge pumping operation through a capacitor and generates the bias voltage VBB, dependently on an oscillation signal from the standby ring oscillator 104a. When the activity control signal φSL instructs that the bias voltage VBB does not reach a predetermined voltage level, the standby ring oscillator 104a also performs oscillation operation. When the activity control signal φSL instructs that the bias voltage VBB reaches the predetermined level, the oscillator 104a stops the oscillation operation.

By providing a bias voltage generating circuit for each of an active cycle and a standby cycle, the operation of the active bias voltage generating circuit 102, which has a large charge supply capability, is stopped in a standby cycle to reduce power consumption. The active pumping circuit 102b and the standby pumping circuit 104b utilize charge pumping operation of capacitors. The capacitance values of these capacitors are different from each other and the charge supply capability of the standby pumping circuit 104b is made smaller. In the charge pumping circuit utilizing the charge pumping operation of a capacitor, its charge supply capability is proportional to the frequency of an oscillation signal and the capacitance of the capacitor that performs the charge pumping operation.

A charge pumping circuit utilizing a capacitor can be formed into various structures. Typical examples of the charge pumping circuit. structure are a single boost type charge pumping circuit and a double boost type charge pumping circuit.

FIG. 15 is a block diagram showing a conventional single boost type charge pumping circuit. In FIG. 15, the single boost type charge pumping circuit includes: an inverter circuit IV1 receiving a clock signal CLK from a ring oscillator; a delay circuit DL1 for delaying an output signal of the inverter circuit IV1; a delay circuit DL2 for delaying an output signal of the delay circuit DL1 further; a NOR gate NG1 receiving output signals of the delay circuits DL1 and DL2; a NAND circuit NG2 receiving the output signal of the inverter circuit IV1 and the. output signal of the delay circuit DL2; a NOR gate NG3 receiving the output signals of the inverter circuit IV1 and the delay circuit DL1; a delay circuit DL3 for delaying the output signal of the NOR gate NG1; a buffer circuit DL4 for delaying the output signal of the NAND circuit NG2; an inverter IV2 for inverting the output signal of the NOR gate NG3; a capacitor C1havingone electrode node coupled to receive the output signal of the delay circuit DL3; a capacitor C2 having one electrode node coupled to receive the output signal of the delay circuit DL4; a capacitor C3 having one electrode node coupled to receive an output signal of the inverter circuit IV2; a P channel MOS transistor Q1 connected between the other electrode node (node NF) of the capacitor C3 and the ground node; P channel MOS transistors Q2 and Q3 connected in series between the node NF and the ground node; a P channel MOS transistor Q4 connected between the other electrode node (node NB) of the capacitor C1 and the ground node and having a gate connected to the node NF; a P channel MOS transistor Q5 connected between the other electrode node (node NE) of the capacitor C2 and the ground node and having a gate connected to the node NF; and a P channel MOS transistor Q6 made conductive selectively, depending on the voltage level of the node NE, to transfer charges between the nodes ND and NO.

P channel MOS transistor Q1 has a gate connected to the ground node so that the transistor Q1 operates in a diode mode to damp the voltage level of the node NF to an absolute value Vthp of its threshold voltage. The MOS transistors Q2 and Q3 each are diode-connected in the forward direction from the ground node to the node NF, so that the voltage level of the node NF is damped on −2·Vthp, wherein Vthp represents the absolute value of the threshold voltage of each of Q1 to Q3. Now, the description will be made of the operation of the single boost type charge pumping circuit shown in FIG. 15.

Suppose such initial state that nodes NA-NF are at a level of the ground voltage Vss (=0V) and the clock signal CLK rises up to an H level. In this case, the output signal of the inverter circuit IV1 falls to an L level. The voltage of the node NB rises to the power supply voltage Vcc after the passage of the delay time of the delay (buffer) circuit DL4. When the delay times of the delay circuits DL1 and the DL2 pass, two inputs of the NOR gate NG1 are at an L level. When the delay time of the delay circuit DL3 passes further, the voltage level of the node NA rises to the level of the power supply voltage Vcc.

The node NC is at a voltage level of 0 V in the initial state. Then the node NC rises in voltage to an H level as the power is on. After the passage of the delay time of the delay circuit DL1, the node NC is driven to the ground voltage level by the inverter circuit IV2 because the NOR gate NG3 receives the L-level signals at both inputs to output an H-level signal. Responsive to the rise in the voltage of the node NA, the voltage level of the node ND is going up toward the power supply voltage Vcc, through the charge pumping operation of the capacitor C1. However, the voltage level of the node NF is at the ground voltage level and the MOS transistor Q4 is in an on-state, so that the voltage level of the node ND is lowered until the MOS transistor Q4 turns off. In a similar way, the voltage level of the node NE is going up toward the power supply voltage Vcc through the charge pumping operation of the capacitor C2. However, the MOS transistor Q5 is in an on-state, and the voltage level at the node NE falls until the MOS transistor Q5 turns into an off-state.

When the clock signal CLK falls from the power supply voltage Vcc level to the ground voltage, the output signal of the inverter circuit IV1 changes to a level of the power supply voltage Vcc so that the output signal of the NOR gate NG3 changes to the L level (the ground voltage level). The voltage level of the node NC attains the power supply voltage Vcc level by the inverter circuit IV2. The voltage level of the node NF is to be raised by the charge pumping operation of the capacitor C3 accordingly. However, in response to on the rise in the voltage of the node NF, the MOS transistor Q1 turns on so that the voltage level of the node NF is clamped at the absolute value Vthp of its threshold voltage. When the voltage of the node NF is clamped at the absolute value Vthp of the threshold voltage, the MOS transistors Q4 and Q5 turn off (since the nodes ND and NE are discharged to a level near the ground voltage).

Subsequently, the output signal of the delay circuit DL1 rises to the power supply voltage level, so that the output signal of the NOR gate NG1 falls to the ground voltage level. After the passage of the delay time of the delay circuit DL3, the voltage of the node NA falls from the power supply voltage Vcc level to the ground voltage level. By the charge pumping operation of the capacitor C1, the voltage level of the node ND falls to a level of −Vcc.

When the delay times of the delay circuits DL1 and DL2 pass, the output signal of the NAND gate NG2 changes to the L level and the voltage level of the node NB falls from the power supply voltage Vcc to the ground voltage level. The voltage level of the node NE drops to a level of −Vcc accordingly. When the voltage level of the node NE drops substantially to a level of −Vcc, the MOS transistor Q6 turns on because the output node NO is at a level near to the ground voltage in the initial state, and negative charges (electrons) are supplied from the node ND to the output node NO.

Next, the clock signal CLK rises up again to the power supply voltage Vcc level, so that the node NB changes from the ground voltage level to the power supply voltage Vcc level. Accordingly, the voltage level of the node NE rises, by Vcc, by the charge pumping operation of the capacitor C2 so that the MOS transistor Q6 turns off. Thus, the supply of the negative charges to the output node NO is stopped.

Subsequently, the output signal of the delay circuit DL1 is changed to the ground voltage level, so that the voltage level of the node NC falls from the power supply voltage Vcc level to the ground voltage level. The voltage of the node NF is to be lowered, by the power supply voltage Vcc, by the charge pumping operation of the capacitor C3. However, the voltage of the node NF is clamped on a voltage level of −2·Vthp through the MOS transistors Q2 and Q3.

Thereafter, the output signal of the delay circuit DL2 is changed to the L level, so that the voltage of the node NA rises from the ground voltage level to the power supply voltage Vcc level and charges are supplied to the node ND accordingly. However, the MOS transistor Q4 is in an on-state and the voltage of the node ND is kept at the ground voltage level.

By repeating the above-mentioned operation, the level of the voltage VBB from the output node NO is lowered. The operation when this state is repeated to attain a stationary state will be described, referring to a waveform diagram of FIG. 16.

The clock signal CLK rises up initially to the power supply voltage Vcc level at time (ta), so that the nodes NA and NB are at the ground voltage level, the node NC is at the power supply voltage Vcc level and the node NE is at a level of −Vcc.

When the delay time of the delay circuit DL4 passes after the clock signal CLK rises up to the power supply voltage Vcc level at time ta, the voltage level of the node NB rises to the power supply voltage Vcc level at time tb. Accordingly, the voltage level of the node NE rises from −Vcc to the ground voltage level and the MOS transistor Q6 turns off.

Subsequently, when the delay time of the delay circuit DL1 passes and two inputs of the NOR gate NG3 change to the L level at time tc, the voltage level of the node NC falls from the power supply voltage Vcc level to the ground voltage level. Subsequently, the voltage level of the node NF also falls by the power supply voltage Vcc level. The voltage of the node NF is clamped on the absolute value Vthp of a threshold voltage by the MOS transistor Q1. Therefore, the voltage level of the node NF drops toward a voltage level of Vthp−Vcc, but the voltage level thereof is clamped on −2·Vthp by the MOS transistors Q2 and Q3. In response to the fall of the voltage level of the node NF, the MOS transistors Q4 and Q5 turn on to hold the voltage of the node NE reliably at the ground voltage level. Consequently, the MOS transistor Q6 turns off so that the operation of supplying electrons to the output node NO is stopped. This node ND is fixed to the ground voltage level by the MOS transistor Q4 that is in an on-state (In FIG. 16, delay of response is shown).

When the delay times of the delay circuits DL1–DL3 pass, the voltage level of the node NA rises to the power supply voltage Vcc level. Even if the voltage level of the node ND is going to rise, the MOS transistor Q4 is in an on-state so that the voltage of the node ND is kept at the ground voltage level.

When the clock signal CLK falls to the ground voltage level at time te, the voltage level of the node NC rises to the power supply voltage Vcc level first. The voltage level of the node NF rises accordingly, and is clamped on the voltage Vthp level by the MOS transistor Q1 (time tf).

Subsequently, when the delay times of the delay circuits DL1 and DL3 pass, the voltage level of the node NA falls to the ground voltage level at time tg. The voltage level of the node ND falls to a level of −Vcc accordingly. The voltage level of the node NE is the ground voltage and the MOS transistor Q6 is kept in the off-state.

Furthermore, when the delay time of the delay circuit DL2 passes and the voltage level of the node NB falls to the ground voltage level at time th, the voltage level of the node NE changes to a level of −Vcc responsively. Moreover, the MOS transistor Q6 turns on, and negative charges are supplied to the output node NO so that the voltage level of the node ND rises correspondingly to the supply of the negative charges.

Therefore, in the single boost type charge pumping circuit shown in FIG. 15, the voltage at the gate (node NE) of the MOS transistor Q6, which is a transfer gate for supplying negative charges to the output gate, changes with an amplitude of the power supply voltage Vcc. Such a circuit is called the single boost type on the basis of this voltage amplitude.

By three-phase-driving the nodes NA-NC, the following operations are successively and precisely carried out: preparation of negative voltage in the node ND, supply of negative charges after stabilization of the negative voltage, and preparatory arranged of a negative charge supplying node after the stop of the supply of the negative charges. Thus, the negative charges can be effectively supplied.

FIG. 17 is a block diagram showing a main portion of a double boost type charge pumping circuit. This block shown in FIG. 17 corresponds to the block represented by the alternate long and short dash line in the single boost type charge pumping circuit in FIG. 15, that is, the portion for receiving the output signal of the NAND circuit NG2 to drive the node NE. That is, by replacing the alternate long and short dash line block in FIG. 15 by the block of the circuit shown in FIG. 17, the charge pumping block shown in FIG. 15 operates as a double boost type charge pumping circuit.

In FIG. 17, the double charge type charge pumping circuit includes an inverter circuit DIV3 for driving a node NG in accordance with the output signal of the NAND gate NG2, a delay circuit DL5 for driving a node NH in accordance with the output signal of the NAND gate NG2, an inverter circuit DIV4 for driving a node NI in accordance with the output signal of the NAND gate NG2, a capacitor C4 connected between the node NG and a node NJ, a capacitor C5 connected between the node NH and a node NK, an N channel MOS transistor NQ4 for connecting a power node to the node NK in accordance with the voltage on the node NJ, an N channel MOS transistor NQ1 connected between the node NJ and the power node, and N channel MOS transistors NQ3 and NQ2 connected in series between the power node and the node NJ.

MOS transistor NQ1 has a back gate and a gate connected together to the power node. Each of MOS transistors NQ2 and NQ3 has a back gate connected to the power node, and a gate connected to a source thereof. MOS transistor NQ1 clamps the voltage level of the node NJ at a level of Vcc−Vthn. MOS transistors NQ3 and NQ2 clamps the voltage level of the node NG at Vcc+2·Vthn, where Vthn is the threshold value of each of the MOS transistors NQ1 to NQ3.

Each of the inverter circuits DIV3 and DIV4 has a delay time. The double boost type charge pumping circuit further includes a P channel MOS transistor PQ for supplying charges at the node NK to a node NL in accordance with the output signal of the inverter circuit DIV4, and N channel MOS transistors NQ5 and NQ6 connected in series between the node NL and the ground node. MOS transistor NQ5 has a gate coupled to receive the power supply voltage Vcc, to function as a resistor for relaxing the electric field. MOS transistor NQ6 has a gate coupled to receive the output signal of the inverter circuit DIV4. A capacitor C6 is connected between the nodes NL and NE.

FIG. 18 is a waveform diagram representing the operation of the double boost section shown in FIG. 17. Referring to FIG. 18, the description will now be made of the operation of the circuit shown in FIG. 17.

The inverter circuit DIV3 has a larger delay time than the inverter circuit DIV4 has. The delay circuit DL5 has a larger delay time than the inverter circuits DIV3 and DIV4 have.

Signal φ from the NAND gate NG2 rises up to the power supply voltage Vcc level at time Ta. When the delay time of the inverter circuit DIV4 passes, the voltage level of the node NI falls from the power supply voltage Vcc level to the ground voltage level, so that the MOS transistor PQ turns on and the MOS transistor NQ6 turns off. The voltage on the node NK transmits to the node NL accordingly. The node NK is at the power supply voltage Vcc level. At time Tb, the voltage level of the node NL rises to the power supply voltage Vcc level. The voltage level of the node NE rises by the power supply voltage Vcc level accordingly, so as to change to a level of −Vcc.

When the delay time of the inverter circuit DIV3 passes, the voltage level of the node NG falls down to the ground voltage level at time Tc. The voltage of the node NJ is going to change by the power supply voltage Vcc level accordingly. However, the voltage level of the node NJ is clamped by the MOS transistor NQ1, to drop to a voltage level of Vcc−Vthn. When the voltage level of the node NJ attains a level of Vcc−Vthn, the MOS transistor NQ4 turns off.

At time Td, the delay time of the delay circuit DL5 passes, and the voltage level of the node NH attains the power supply voltage Vcc level. As a result, the voltage level of the node NK rises from the power supply voltage Vcc level to 2·Vcc by the charge pumping operation of the capacitor C5. The voltage level of the node NL rises to 2·Vcc accordingly. By the capacitor C6, the voltage level of the node NE rises by the power supply voltage Vcc and the voltage level of the node NE attains the ground voltage level.

The signal φ from the NAND gate NG2 falls to the ground voltage level at time Te. As a result, the voltage level of the node NI attains the Vcc level at time Tf by the inverter circuit DIV4 so that MOS transistor NQ6 turns on. Charges of the node NL are discharged accordingly, so that the node NL attains the ground voltage level. The voltage level of the node NI rises from the ground level to the power supply voltage Vcc, so that the voltage level of the node NK is 2·Vcc and MOS transistor PQ is in an on-state. Therefore, charges are discharged from the node NK to the ground node through the MOS transistor PQ and the MOS transistor NQ6. The voltage level of the node NK drops to the power supply voltage Vcc by the discharge, so that the voltage levels of the gate and the source of the MOS transistor PQ become equal so that the MOS transistor turns off. Therefore, the discharging continues until the voltage level of the node NK drops from 2·Vcc to the power supply voltage Vcc.

The voltage of the node NE drops to −2·Vcc in response to the drop in the voltage level of the node NL.

At time Tg, the voltage level of the node NG rises to the power supply voltage Vcc, and the voltage level of the node NJ rises by the charge pumping operation of the capacitor C4. However, the voltage level of the node NJ is clamped on a level of Vcc+2·Vthn by the MOS transistors NQ2 and NQ3. The node NK is at a voltage level of 2·Vcc and the MOS transistor NQ4 is kept in an off-state.

At time Th, the voltage level of the node NH drops from the power supply voltage Vcc to the ground voltage level, in accordance with the output signal of the delay circuit DL5. At the above-mentioned time Tg, the voltage of the node NJ is already set to a level higher than the power supply voltage and the N channel MOS transistor NQ4 is in an on-state. This node NK is connected to the power node through the N channel MOS transistor NQ4. Therefore, the charges supplied from the power node compensate for the drop in the voltage of the node NK by the charge pumping operation of the capacitor C5, so that the voltage level of the node NK is kept at the power supply voltage Vcc level.

Accordingly, in the double boost section shown in FIG. 17, the amplitude of the voltage at the node NE is 2·Vcc. The circuit of this type is called the double boost type. In the double boost type charge pumping circuit, the gate-source voltage of the MOS transistor Q6, which supplies charges, becomes large, so that its charge supply capability also becomes large. Therefore, charges can be supplied at a higher speed.

The number of constituent elements of the single boost type charge pumping circuit is smaller than that of constituent elements of the double boost type charge pumping circuit. Thus, the single type has advantages that its circuit occupation area is small and that because of its simple circuit structure its reliability and yield are high. However, the gate voltage of the transistor Q6 for transferring charges can be driven to −Vcc at lowest, and the negative voltage that can be generated is −Vcc+Vthp. Thus, a negative voltage having a sufficient voltage level can not be generated. In the case where the power supply voltage Vcc and the absolute value Vthp of the threshold voltage are, for example, 1.5 V and 0.7 V, respectively, more negative voltages than −0.8 V cannot be generated.

On the other hand, in the case of the double boost type charge pumping circuit, the gate voltage of the transistor Q6 for transferring charges drops down to −2·Vcc. It is therefore possible to generate and supply a negative voltage having a sufficient voltage level stably even under any low power supply voltage. In the double boost section shown in FIG. 17, however, the voltage of its internal node changes with an amplitude of 2·Vcc. Therefore, in the case where the power supply voltage Vcc is high, the reliability of the element (the reliability of the gate insulating film) drops, so that a problem that the power supply voltage cannot be made high arises. Therefore, in the case that the power supply voltage level is high, it is necessary that the voltage down converted by an internal voltage down converter is used as pumping power supply voltage. Thus, only a negative voltage having a level similar to that generated in the single boost type circuit can be generated. In short, the advantage of the double boost type is lost. In the case that the internal voltage down converter is provided for substrate bias, a problem that the occupation area of this circuit and the power consumption increase arises.

In the test (the screening test) of a semiconductor device, the device is operated under various power supply voltage levels to detect a failure. When the double boost type charge pumping circuit is used in this test, its highest power supply voltage level is limited by the dielectric breakdown voltage of elements of its double boost section, so that applied voltage cannot be made adequately high. Thus, the reliability of its internal circuit cannot be guaranteed sufficiently. In the case that the power supply voltage of the single boost type charge pumping circuit is made low, a negative voltage VBB having an adequate voltage level cannot be generated, so that the operation of its internal circuit cannot be stabilized. Thus, the test cannot be precisely made. Therefore, there arise problems that the test is insufficient and the reliability and the yield of the semiconductor devices drop.

Accordingly, in the case that a charge pumping circuit for substrate bias is mounted on a semiconductor chip, after due consideration of its specification it is decided which type of the charge pumping circuit is used dependently on the power supply voltage level of the specification. Thus, it is necessary to change circuit design whenever the specification is changed. Thus, there arises a problem that it becomes impossible to cope with the change in the specification flexibly. The power supply voltage of the charge pumping circuit is mainly decided by the power supply voltage of the system in which the semiconductor memory device is used. Thus, in the case that the charge pumping circuit is designed dependently on use thereof, it is necessary to change the design of the circuit dependently on the specific power supply voltage. Thus, the efficiency of the design is lowered, to result in a problem that costs of the devices rise.

The above-mentioned problems occur not only in the charge pumping circuit for generating a negative voltage but also in an internal voltage generating circuit for generating a high voltage transmitted to word lines in a semiconductor memory device and such.

SUMMARY OF THE INVENTION

An object of the present invention is to provide a semiconductor device capable of generating an internal voltage having a desired voltage level stably, regardless of the voltage level of a power supply voltage.

Another object of the present invention is to provide a semiconductor device adaptable with change in the specification of an external power source easily.

A further object of the present invention is to provide a semiconductor device having improved reliability and yield.

A still further object of the present invention is to provide a semiconductor device capable of generating a substrate bias voltage stably and effectively.

The semiconductor device according to an aspect of the present invention includes a first internal voltage generating circuit in a first operation mode for generating an internal voltage at a predetermined voltage level, and a second internal voltage generating circuit, having a second operation mode that is different from said first operation mode, for generating internal voltage having said predetermined voltage level. The first internal voltage generating circuit and the second internal voltage generating circuit can operate selectively.

The semiconductor device according to another aspect of the present invention includes an internal voltage generating circuit for applying a control signal having a first amplitude to a control gate of a transfer gate for transferring charges to an output node, to generate, at the output node, an internal voltage having a voltage level whose maximum absolute value is defined by the amplitude of the control signal; and a circuit for changing the amplitude of the control signal of the internal voltage generating circuit into a second amplitude different from the first amplitude in response to a switch signal.

The semiconductor device according to further aspect of the present invention includes an internal voltage generating circuit for applying a control signal to a control gate of a transfer gate for transferring charges to an output node, to generate, at the output node, an internal voltage having a predetermined voltage level; and a circuit for setting the amplitude of the control signal of the internal voltage generating circuit to either of a first amplitude and a second amplitude which is smaller than the first amplitude, in response to a switch signal.

Preferably, there are arranged a single boost type substrate bias generating circuit for generating a bias voltage applied to a substrate region through charge pumping operation; and a double boost type substrate bias generating circuit for generating a bias voltage applied to the substrate region through charge pumping operation. The double boost type substrate bias generating circuit is mounted, together with the single boost type substrate bias generating circuit, on a common semiconductor chip. In a practical use, either one of the single boost type substrate bias generating circuit and the double boost type substrate bias generating circuit can be used.

By selectively operating the internal voltage generating circuits having different operation modes prepared together, it is possible to use the optimal internal voltage generating circuit dependently on the voltage level of an external power source, and change in the specification of the power source can be coped with flexibly. In a test, by allowing the internal voltage generating circuit suitable for a test power supply voltage level to operate, the internal circuitry can be precisely tested to improve reliability and yield.

Regardless of a voltage level of an external power source, internal voltage can be generated using the external power source. Thus, it becomes unnecessary to use any internal voltage down converter for generating an internal voltage, and it also becomes possible to reduce power consumption.

By forming the internal voltage generating circuits in the different operation forms in the same circuit, their constituent elements can be made common. In this case, the occupation area of the internal voltage generating circuitry can be made smaller than in the case that these circuits are separately. formed.

In the case that this internal voltage generating circuit is a substrate bias generating circuit, substantially the same advantages can be obtained.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 7 is a circuit diagram of a modification 2 of the fourth embodiment of the present invention;

DESCRIPTION OF THE PREFERRED EMBODIMENTS

First Embodiment

Figure 1:
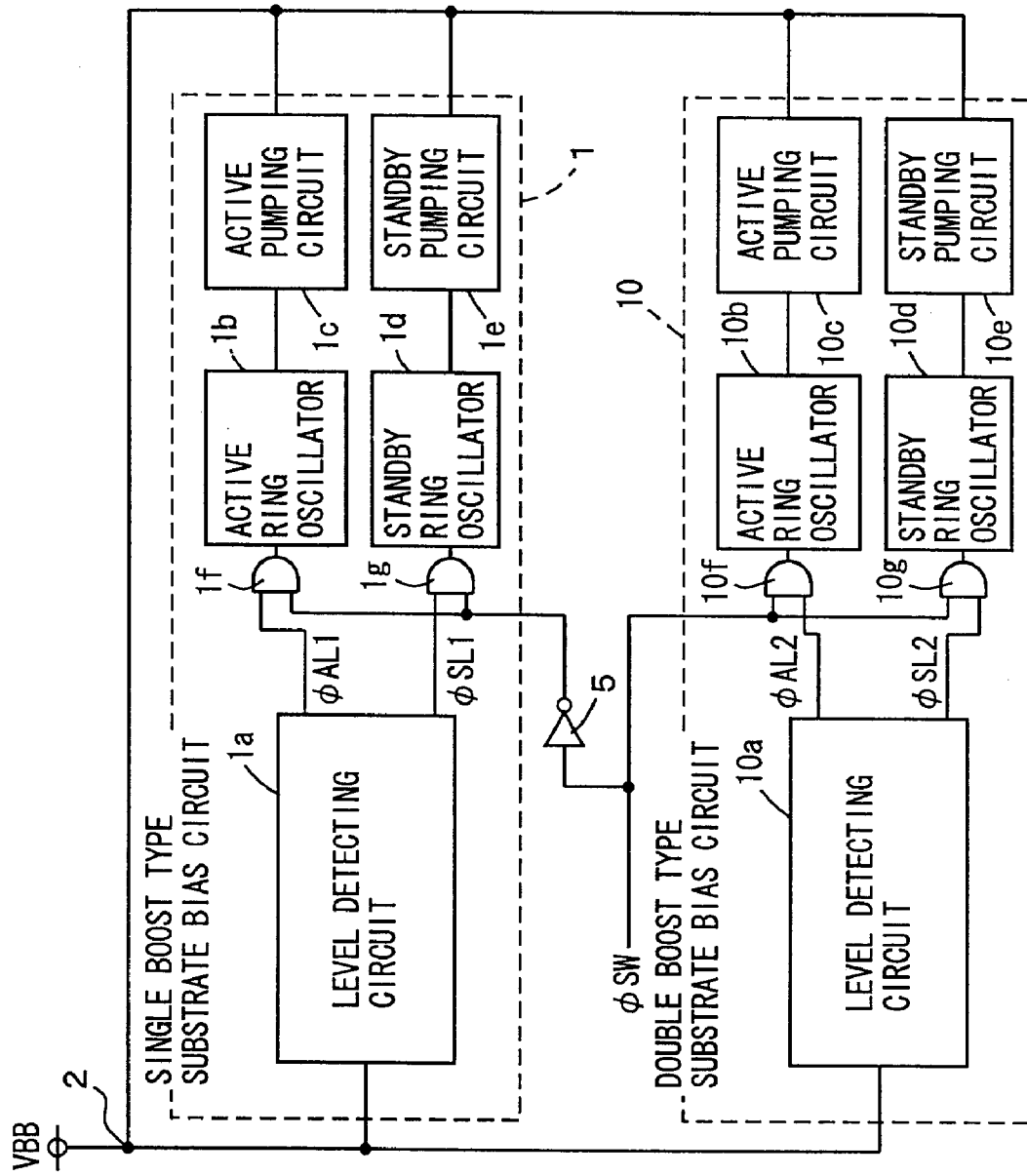
FIG. 1 is a block diagram of a substrate bias circuit according to a first embodiment of the present invention.

FIG. 1 is a block diagram showing a structure of a substrate bias circuit according to the first embodiment of the present invention. In FIG. 1, the substrate bias circuit includes a single boost type substrate bias circuit 1 and a double boost type substrate bias circuit 10. The single boost type substrate bias circuit 1 and the double boost type substrate bias circuit 10 are formed on the same chip, and are connected commonly to an output node 2. In order to activate the substrate bias circuit 1 or 10 selectively, an inverter circuit 5 receiving switch signal φSW is provided. By this switch signal φSW, one of the substrate bias circuits 1 and 10 is activated and the other is inactivated.

The single boost type substrate bias circuit 1 includes: a level detecting circuit 1a for detecting the voltage level of substrate bias voltage VBB of the output node 2; an active ring oscillator 1b that performs oscillation operation in a predetermined cycle when activated; an active pumping circuit 1c that receives the oscillation signal from the active ring oscillator 1b and performs charge pumping operation to generate a negative voltage; a standby ring oscillator 1d that performs oscillation operation in a standby state; a standby pumping circuit 1e that receives the oscillation signal from the standby ring oscillator 1d and performs charge pumping operation to generate a negative voltage; a gate circuit 1f that receives active level detection signal φAL1 from the level detecting circuit 1a and the output signal from the inverter circuit 5a to activate the active ring oscillator 1b selectively; and a gate circuit 1g that receive standby level detection signal φSL1 from the level detecting circuit 1a and the output signal from the inverter circuit 5 to activate the standby ring oscillator 1d selectively. Each of the gate circuits 1f and 1g is composed of, for example, an AND circuit.

The double boost type substrate bias circuit 10 includes: a level detecting circuit 10a; an active ring oscillator 10b that performs oscillation operation in a predetermined cycle when activated in an active cycle; an active pumping circuit 10c that performs charge pumping operation in accordance with the oscillation signal from the active ring oscillator 10b to generate a negative voltage; a standby ring oscillator 10d that performs oscillation operation in a predetermined cycle in standby; a standby pumping circuit 1e that performs charge pumping operation in accordance with the oscillation signal from the standby ring oscillator 10d to generate a negative voltage; a gate circuit 10f that receives the switch signal φSW and an active level detection signal φAL2 from the level detecting circuit 10a to activate the active ring oscillator 10b selectively; and a gate circuit 10g that receives a standby level detection signal φSL2 from the level detecting circuit 10a and the switch signal φSW to activate the standby ring oscillator 10d selectively. Each of the gate circuits 10f and 10g is composed of, for example, an AND circuit.

When the output signals of the gate circuits 1f, 1g, 10f and 10g are at an H level, the corresponding ring oscillators 1b, 1d, 10b and 10d are activated to perform oscillation operation. Each of these ring oscillators 1b, 1d, 10b and 10d is composed of, for example, cascaded inverters of an even number of stages, and a NAND circuit that receives the output signal of the inverter at the last stage in the cascade and the output signal of the corresponding gate circuit to apply the output signal thereof to the inverter at the first stage in the cascade. The level detecting circuits 1a and 10a, and the pumping circuits 1c, 1e, 10c and 10e have the same structures as in the conventional art.

In the structure shown in FIG. 1, when the switch signal φSW is at an L level, the output signal of the inverter circuit 5 attains an H level so that the gate circuits 1f and 1g are enabled to activate the ring oscillators 1b and 1d selectively in accordance with the level detection signals φAL1 and φSL1. On the other hand, the output signals of the gate circuits 10f and 10g are fixed at an L level regardless of the logic level of the level detection signals φAL2 and φSL2 from the level detection circuit 10a, to stop the oscillation operation of the ring oscillators 10b and 10d. Accordingly, when the switch signal φSW is at an L level, the bias voltage VBB is generated by the single boost type substrate bias circuit 1.

Contrarily, when the switch signal φSW is at an H level, the output signal of the inverter 5 attains an L level, the gate circuits 1f and 1g are disabled to output signals fixed to an L level, to stop the oscillation operation of the oscillators 1b and 1d. In the double boost type substrate bias circuit 10, the gate circuits 10f and 10g are enabled to activate the ring oscillator 10b and 10d selectively in accordance with the level detection signals φAL2 and φSL2. In this case, therefore, the bias voltage VBB is generated by the double boost type substrate bias circuit 10.

This switch signal φSW activates either one of the substrate bias circuits 1 and 10 in accordance with the voltage level of the used power supply voltage (external power supply voltage) Vcc. When the voltage level of the power supply voltage Vcc is, for example, low, the double boost type substrate bias circuit 10 is used to ensure the supplying capability of the bias voltage VBB. When the power supply voltage Vcc is high, the substrate bias circuit 1 is used to prevent dielectric breakdown of the gate insulating films of the transistors and generate bias voltage VBB stably. In this way, it is possible to maintain the reliability of the transistors and to improve the reliability and the yield thereof.

Dependently on the voltage level of the used power supply voltage, only one of the substrate bias circuits 1 and 10 is used so that the bias voltage VBB can be generated using the external power supply voltage directly in any cases. Therefore, it is unnecessary that any internal voltage down converting circuit is arranged. Thus, it is possible to reduce the occupation area of the circuit and power consumption and improve the yield of chips per wafer.

Upon test operation, by changing the voltage level of the switch signal φSW with a tester, it is possible to operate either one of the substrate bias circuits 1 and 10 in accordance with the voltage level of the test power supply voltage, for generating the bias voltage VBB stably to perform an accelerated test of the internal circuit, resulting in improved reliability of the whole circuit.

[Modification]

Figure 2:
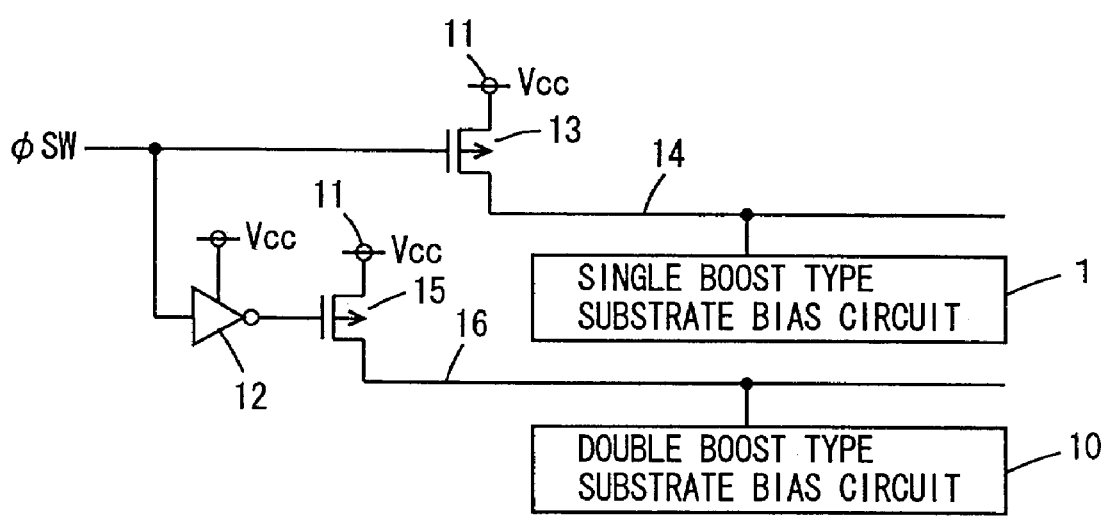
FIG. 2 is a block diagram of a modification of the substrate bias circuit of the first embodiment.

FIG. 2 is a block diagram showing a structure of a modification of power source elements of the substrate bias circuit according to the first embodiment of the present invention. In FIG. 2, a power source control circuit includes: an inverter circuit 12 receiving switch signal φSW, a P channel MOS transistor 13 made conductive when the switch signal φSW is at an L level to connect an external power node 11 to a power supply line 14; and a P channel MOS transistor 15 made conductive when the output signal of the inverter circuit 12 is at an L level to connect the external power node 11 to a power supply line 16. Power supply voltage is supplied to the single boost type substrate bias circuit 1 through the power supply line 14, and is supplied to the double boost type substrate bias circuit 10 through the power supply line 16. The inverter circuit 12 receives the external power supply voltage Vcc as one operation power supply voltage to operate.

In structure shown in FIG. 2, the power supply voltage is supplied only to the substrate bias circuit that operates actually in accordance with the switch signal φSW. More specifically, when the switch φSW is at an L level and the single boost type substrate bias circuit 1 is set into the enabled or operable state, the MOS transistor 13 turns on so that the power supply line 14 is connected to the external source node 11. In this state, the MOS transistor 15 turns off so that the external power source node 11 is isolated from the power supply line 16. Thus, no power supply voltage is supplied to the double boost type substrate bias circuit 10, preventing the phenomenon that when the power supply voltage Vcc is high, a voltage at an unnecessary high level is generated in the double boost type substrate bias circuit 10 to clamp an internal node at a high voltage level. The power supply voltage is supplied only to the circuit that operates actually to reduce consumption power.

By switching the power supply voltage level supplying path by the switch signal φSW, it is possible to activate, upon a test thereof, either one of the substrate bias circuits 1 and 10 selectively in accordance with the voltage level of the test power supply voltage, and to perform an accelerated test of an internal circuit precisely.

The power supply lines of the substrate bias circuits 1 and 10 may be selectively connected to a power source pad by mask interconnection.

As described above, according to the first embodiment of the present invention, the single boost type substrate bias circuit and the double boost type substrate bias circuit are arranged and either one is set in the operable state, and therefore it is possible to generate a bias voltage stably regardless of the voltage level of the power supply voltage and to improve the reliability and the yield.

Second Embodiment

Figure 3:
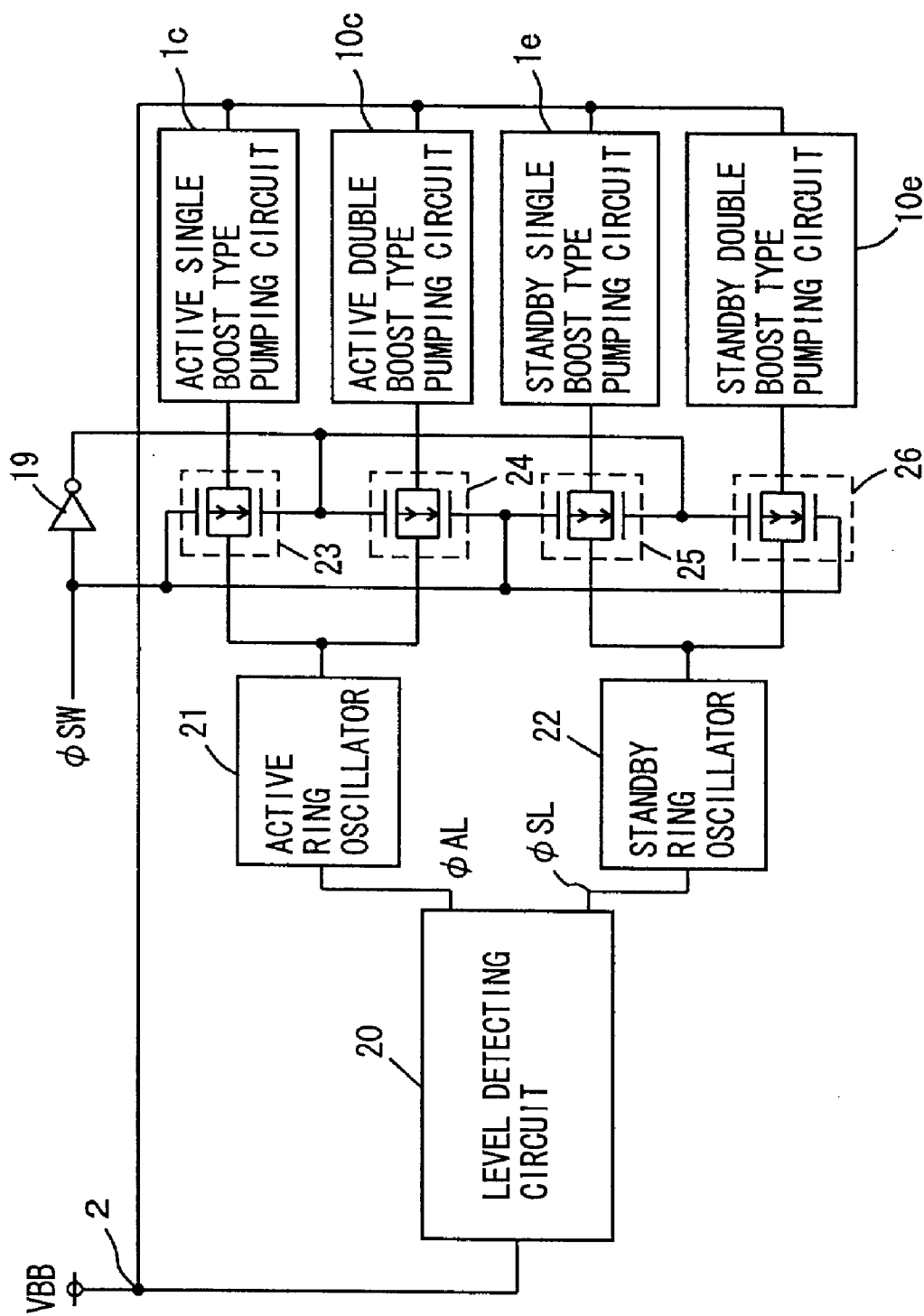
FIG. 3 is a block diagram of a substrate bias circuit according to a second embodiment of the present invention.

FIG. 3 is a block diagram of a substrate bias circuit according to the second embodiment of the present invention. In FIG. 3, a level detecting circuit 20, an active ring oscillator 21 and a standby ring oscillator 22 are arranged in common to a single boost type substrate bias circuit and a double boost type substrate bias circuit.

To implement the single boost type and the double boost type, there are arranged an active single boost type pumping circuit 1c, an active double boost type pumping circuit 10c, a standby single boost type pumping circuit 1e, and a standby single boost type pumping circuit 10e.

To activate these pumping circuits selectively, CMOS transfer gates 23–26 are arranged, which operate selectively in accordance with switch signal φSW and a complementary switch signal from the inverter circuit 19 that receives the switch signal φSW. The CMOS transfer gates 23 and 24 conduct complementarily to each other. Thus, when either of them conducts, the oscillation signal from the active ring oscillator 21 is transmitted to the corresponding one of the pumping circuits 1c and 10c. The CMOS transfer gates 25 and 26 conduct complementarily to each other in response to the switch sign φSW. Thus, when either of them conducts, the oscillation signal from the standby ring oscillator 22 is transmitted to the corresponding one of the pumping circuits 1e and 10e. The pumping circuits 1c, 10c, 1e and 10e are in common connected to an output node 2 to generate bias voltage VBB at the output node 2.

When the switch signal φSW is at an L level, the output signal of the inverter circuit 19 attains an H level so that the transfer gates 23 and 25 enter the conductive state, and the transfer gates 24 and 26 enter a non-conductive state. As a result, the oscillation signals from the ring oscillators 21 and 22 are transmitted to the single boost type pumping circuits 1c and 1e. The ring oscillators 21 and 22 are selectively activated in accordance with the level detection signals φAL and φSL from the level detecting circuit 20 to perform oscillation operation. The pumping circuits 1c and 1e of the single boost type perform pumping operation in accordance with these oscillation signals so as to supply charges to generate the bias voltage VBB. Thus, a single boost type substrate bias circuit is implemented.

In this state, the CMOS transfer gates 24 and 26 are in a non-conductive state. Thus, no oscillation signals are transmitted to the double boost type pumping circuits 10c and 10e so that the pumping circuits 10c and 10e do not perform pumping operation. At this time, the supply of the power supply voltage to the double boost type pumping circuits 10c and 10e may be stopped by the switch signal φSW in the same way as shown in FIG. 2.

When the switch signal φSW is at an H level, the transfer gates 24 and 26 enter a conductive state and the transfer gates 23 and 25 enter a non-conductive state, so that the oscillation signals from the ring oscillators 21 and 22 are transmitted to the double boost type pumping circuits 10c and 10e. In this case, therefore, a double boost type substrate bias circuit is implemented.

The circuit shown in FIG. 3 provides the advantages of the first embodiment as well as the following additional advantage The single boost type and the double boost type share the level detecting circuit 20 and the ring oscillators 21 and 22 so as to be able to reduce the occupation area of the circuit and to improve the yield of chips per wafer for reducing costs of semiconductor devices.

Third Embodiment

Figure 4:
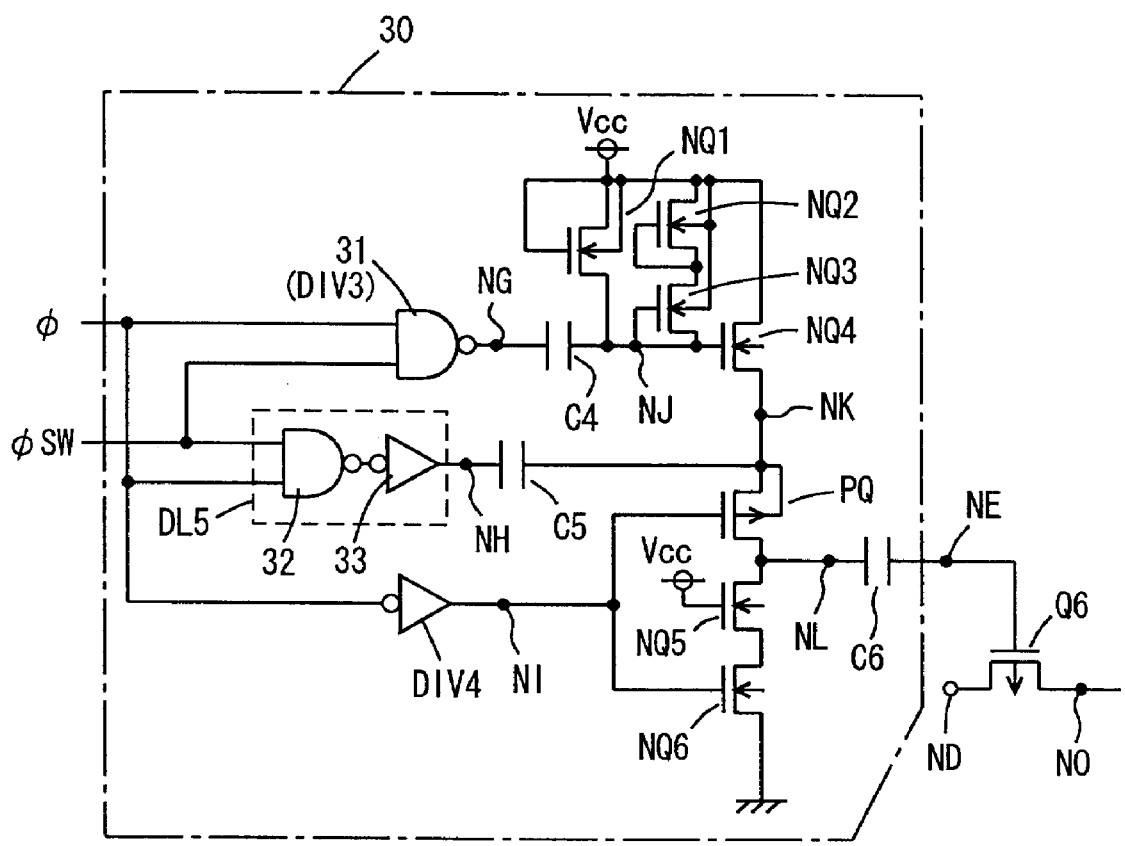
FIG. 4 is a circuit diagram of a main part of a substrate bias circuit according to a third embodiment of the present invention.

FIG. 4 is a circuit diagram of a main part of a substrate bias circuit according to the third embodiment of the present invention. FIG. 4 shows a double boost section of a double boost type pumping circuit. The double boost section 30 corresponds to the region enclosed with the alternate long and short dash line in the single boost type pumping circuit shown in FIG. 15. A node NE in the double boost section 30 is connected to the gate of a charge transferring P channel MOS transistor Q6. Other elements are the same as those in FIG. 15.

Figure 17:
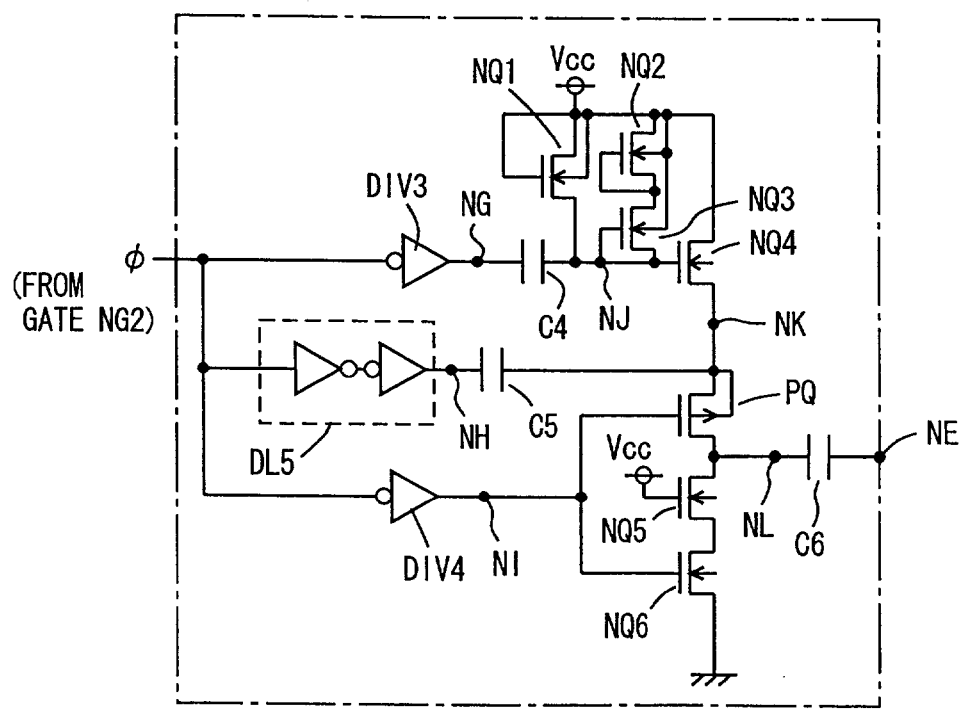
FIG. 17 is a circuit diagram showing a structure of a conventional double boost type substrate bias circuit.
Figure 18:
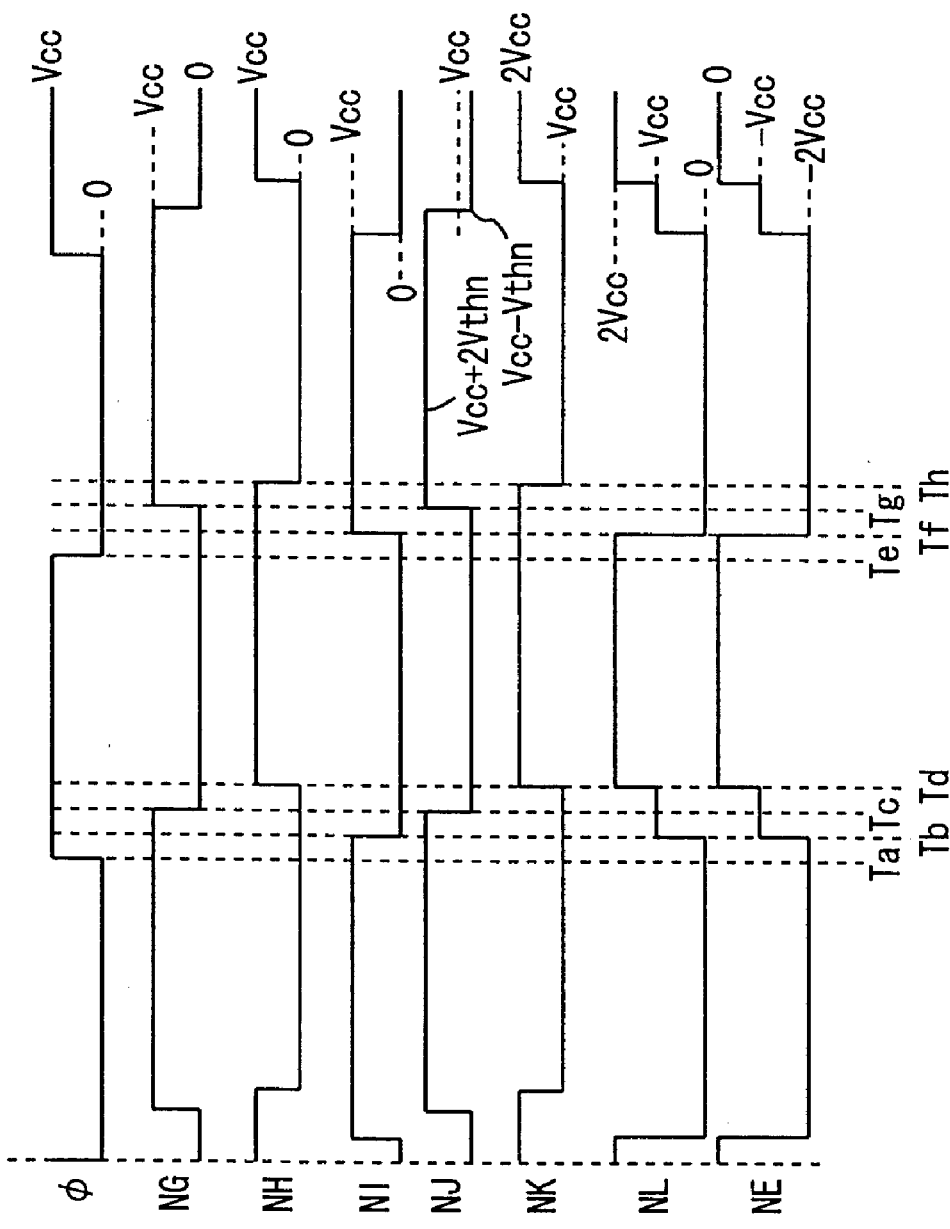
FIG. 18 is a waveform diagram representing the operation of the circuit shown in FIG. 17.

In the double boost section 30 shown in FIG. 4, instead of the delay inverter circuit DIV3 in the conventional double boost section shown in FIG. 17, there are arranged a NAND circuit 31 that receives switch signal φSW and output signal φ from the NAND gate NG2 (see FIG. 15) at the preceding stage. A delay circuit DL5 is composed of a NAND circuit 32 that receives the switch signal φSW and the output signal (referred to as the clock signal hereinafter) φ from the NAND gate NG2, and an inverter circuit 33 that receives the output signal of the NAND circuit 32, instead of the cascaded inverters.

Other elements are the same as those shown in FIG. 17. The same reference numbers are attached to the corresponding elements, and detailed explanation thereof is omitted.

In the structure of the double boost section 30 shown in FIG. 4, when the switch φSW is at an L level, the output signal of the NAND circuit 31 is fixed to an H level and the output signal of the delay circuit DL5 is fixed to an L level. Therefore, the voltage of the node NG is fixed to the power supply voltage Vcc of the external power node, and the voltage of the node NJ is kept at the power supply voltage Vcc. Thus, the MOS transistor NQ4 is kept in the on-state and the voltage of the node NK is substantially at the external power supply voltage (that is, the power supply voltage) Vcc. In this case, the node NH is fixed to an L level, but charges from the MOS transistor NQ4 are supplied to the node NK so that the node NK is kept substantially at the power supply voltage Vcc level.

In the case that the inverter circuit DIV4 operates in accordance with the clock signal φ, the MOS transistor NQ6 turns off when the P channel MOS transistor PQ turns on. Responsively, the voltage of the node NK is transmitted to the node NL so that the voltage of the node NL attains substantially the power supply voltage Vcc.

In the case that the MOS transistor NQ6 turns on in accordance with the output signal of the inverter circuit DIV4, the MOS transistor PQ turns off and the voltage of the node NL attains the ground voltage level. Therefore, the voltage of the node NL changes between the ground voltage and the power supply voltage Vcc so that the gate voltage of the charge transferring MOS transistor Q6 changes between the ground voltage and negative voltage −Vcc (due to the operation of the other members of the circuit). This double boost section 30 operates as a single boost type circuit.

On the other hand, when the switch signal φSW is at an H level, the NAND circuit 31 operates as a delay inverter circuit and the NAND circuit 32 also operates as a delay inverter circuit. Thus, this double boost section 30 operates in the same way as the double boost section shown in FIG. 17.

In the instant substrate bias circuit, only the double boost type substrate bias circuit is arranged and the double boost section is selectively operated as a single boost section in accordance with the switch signal φSW. The single double boost type substrate bias circuit is used as a basic structure, so that the circuit occupation area can be reduced. Accordingly, with the circuit according to the third embodiment the occupation area thereof and the area of the chip can be further reduced as compared to the circuit according to the first embodiment.

Fourth Embodiment

Figure 5:
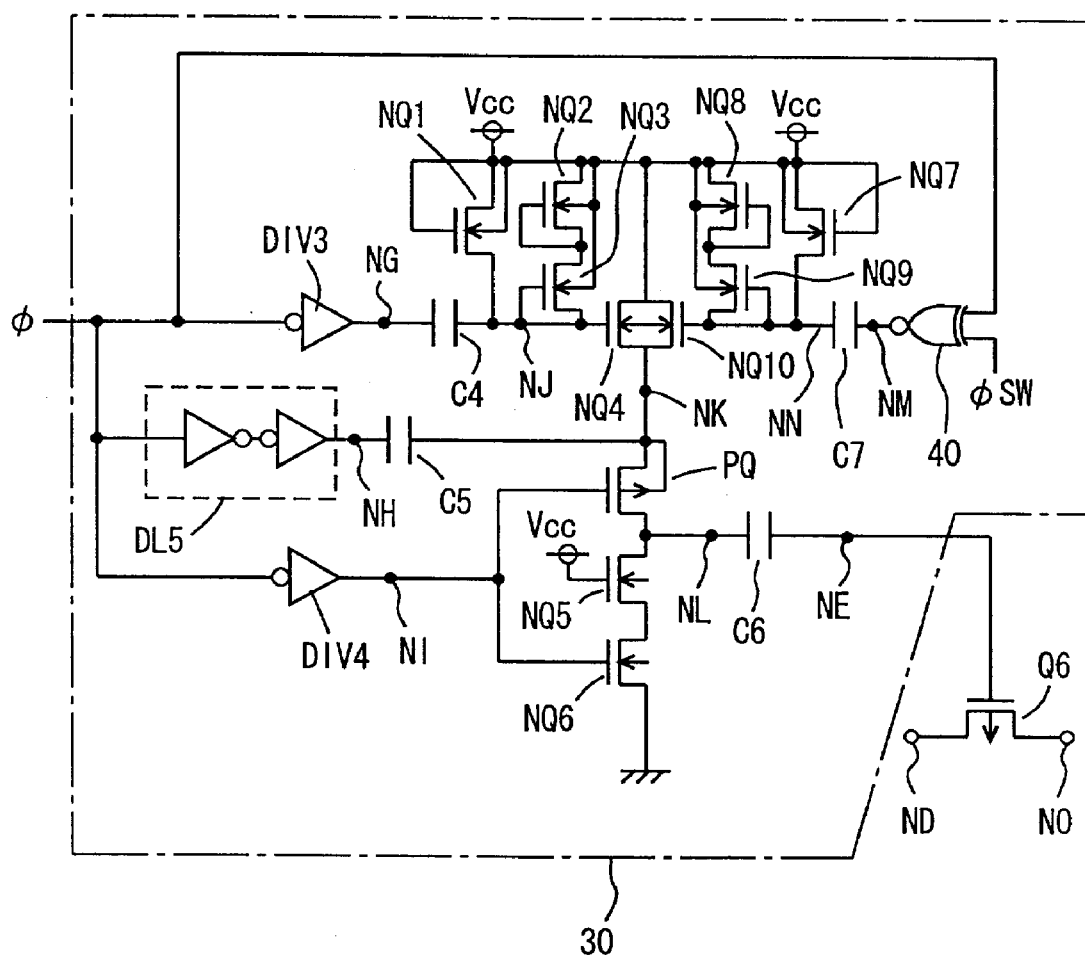
FIG. 5 is a circuit diagram showing a main part of a substrate bias circuit according to a fourth embodiment of the present invention.

FIG. 5 is a circuit diagram showing a structure of a main part of a substrate bias circuit according to the fourth embodiment of the present invention. FIG. 5 also shows its double boost section. As the substrate bias circuit, a double boost type substrate bias circuit is arranged and this double boost section is selectively set to the circuit of the single boost type or the double boost type in accordance with switch signal φSW.

In FIG. 5, a double boost section 30 include, in addition to the elements of the double boost section shown in FIG. 17: an N channel MOS transistor NQ7 connected between a node NN and a power node receiving an external power supply voltage and having a gate connected to the power node; N channel MOS transistors NQ8 and NQ9 connected in series between the power node and the node NN; an N channel MOS transistor NQ10 for selectively connecting the power node to the node NK in response to the voltage on the node NN; an EXNOR circuit 40 receiving a clock signal φ (output signal φ of an NAND gate NG2 at the preceding stage) and the switch signal φSW; and a capacitor C7 for supplying charges to the node NN in accordance with the output signal from the EXNOR circuit 40. The EXNOR circuit 40 operates as a consistency detecting circuit, and outputs an H level (power supply voltage Vcc level) when logic levels of the clock signal φ and the switch signal φSW are equal to each other.

When the switch signal φSW is set to an L level in the double boost section 30 shown in FIG. 5, an H level signal is outputted from the EXNOR circuit 40 when the clock signal φ is at an L level. An L level signal is outputted from the EXNOR circuit 40 when the clock signal φ is at an H level. Therefore, a signal whose phase is shifted by 180 degrees relative to the clock signal φ is transmitted to node NM. Namely, the EXNOR circuit 40 operates as an inverter circuit when the switch signal φSW is at an H level so that the voltages at the nodes NG and NM change in the common phase. Therefore, the MOS transistors NQ4 and NQ10 enter a conductive or non-conductive state in the same phase and at maximum a voltage of 2·Vcc is supplied to the node NK. This double boost section 30 outputs a signal with an amplitude of 2·Vcc to a node NE.

On the other hand, when the switch signal φSW is set to an H level, the EXNOR circuit 40 operates as a buffer circuit. Therefore, the signal of an output node NM of the EXNOR circuit 40 changes in anti-phase relative to the signal at the output node NG of the inverter circuit DIV3. Namely, when a node NJ is at a high level (Vcc+2·Vthn), the node NN is at a low level (Vcc−Vthn). Reversibly, when the node NJ is at the low level, the node NN goes to the high level. Therefore, when the MOS transistor NQ4 is in an off-state, the MOS transistor NQ10 is in an on-state. Reversibly, when the MOS transistor NQ4 is in an on-state, the MOS transistor NQ10 is in an off-state.

Figure 15:
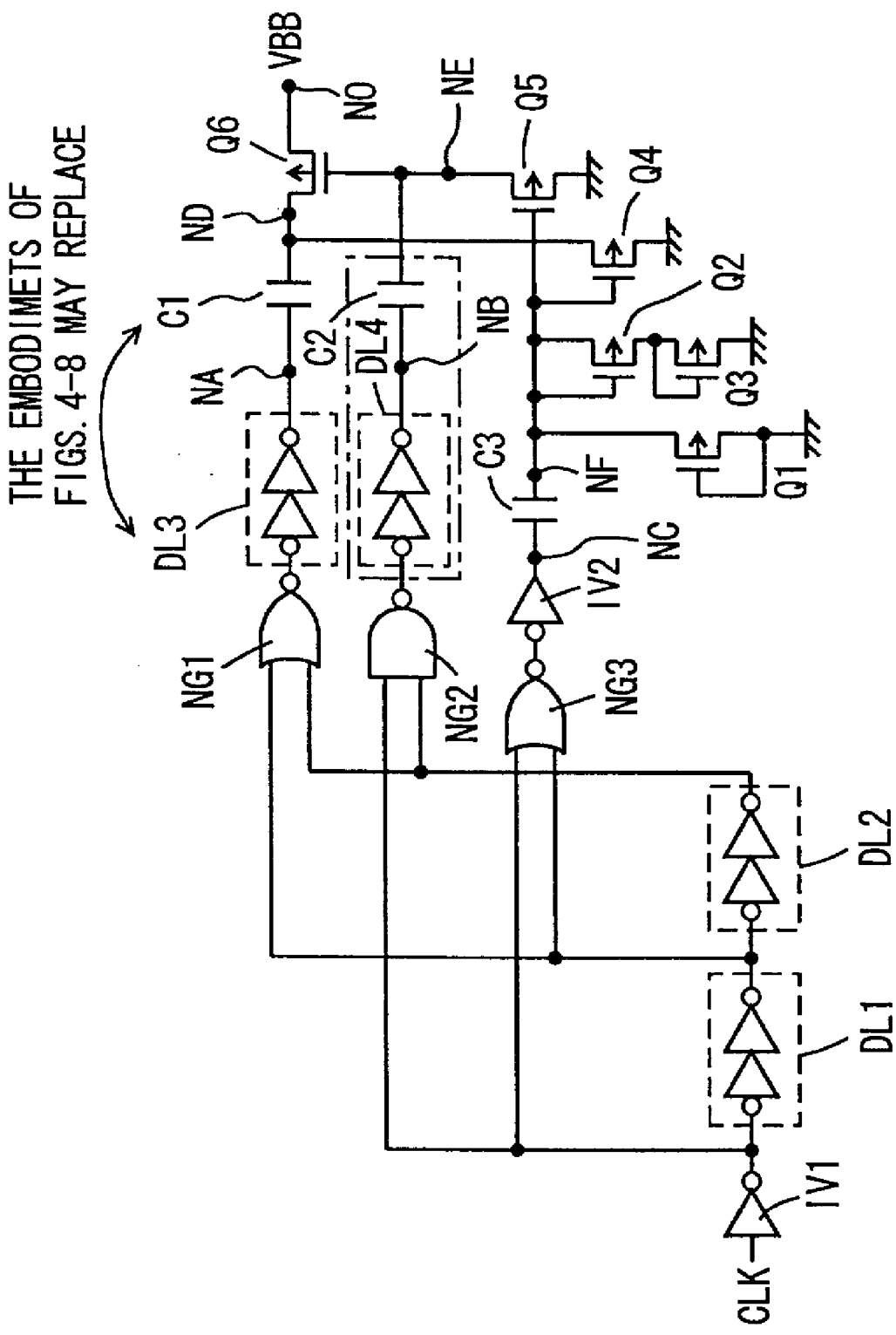
FIG. 15 is a circuit diagram showing a structure of a conventional single boost type substrate bias circuit.
Figure 16:
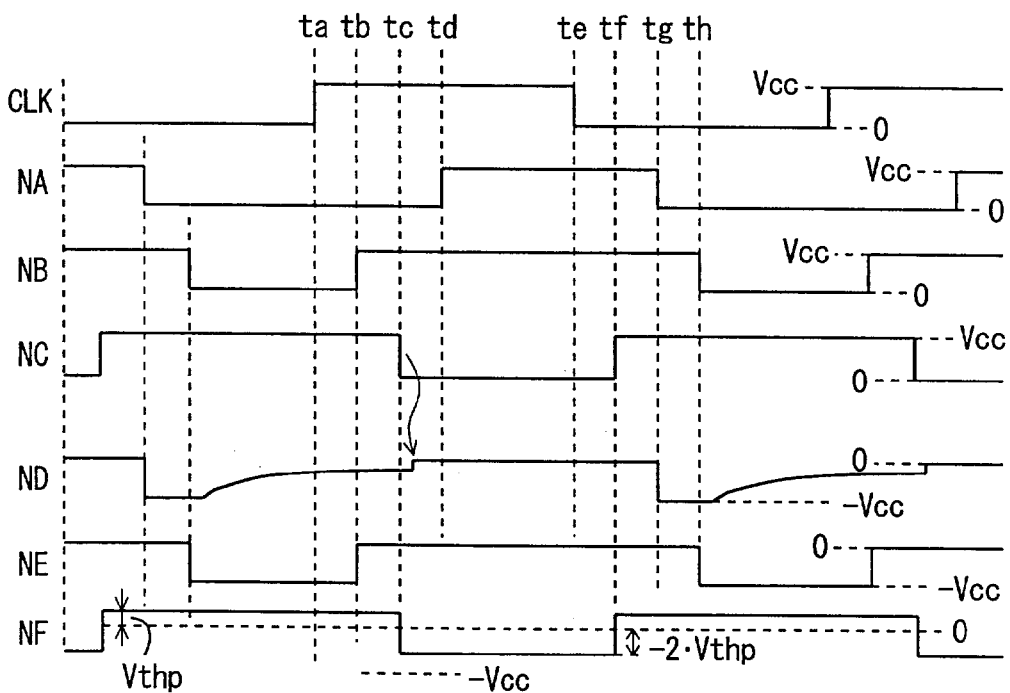
FIG. 16 is a waveform diagram representing the operation of the circuit shown in FIG. 15.

That is, the node NK is constantly connected to the power node, so that all of introduced charges are discharged to the external power node even if a capacitor C5 performs charge pumping operation. The voltage level of the node NK is kept at the power supply voltage Vcc level. The high level voltage of the gates of the MOS transistors NQ4 and NQ10 is Vcc+2·Vthn, and therefore, the power supply voltage Vcc is transmitted to the node NK without being affected by the threshold voltage of these MOS transistors. Accordingly, the amplitude of the signal of the node NE in the double boost section 30 is Vcc. This double boost section 30 operates as a single boost type circuit. As shown in FIG. 15, a MOS transistor NQ5 is connected to the node NE, and the voltage of the node NE changes between the ground voltage and a negative voltage −Vcc.

In this double boost type substrate bias circuit, its double boost section can be operated as a single boost type circuit, and therefore, it is possible to operate this circuit as either a single boost type or a double boost type, without changing of the structure of the circuit, dependently on the voltage level of the power supply voltage Vcc. According to this structure, it is possible to make the circuit occupation area and the chip area smaller as compared to in the structure in which that bias substrate generating circuits of a single boost type and a double boost type are separately arranged. The same advantages provided by the first to third embodiments can be achieved.

[Modification]

Figure 6:
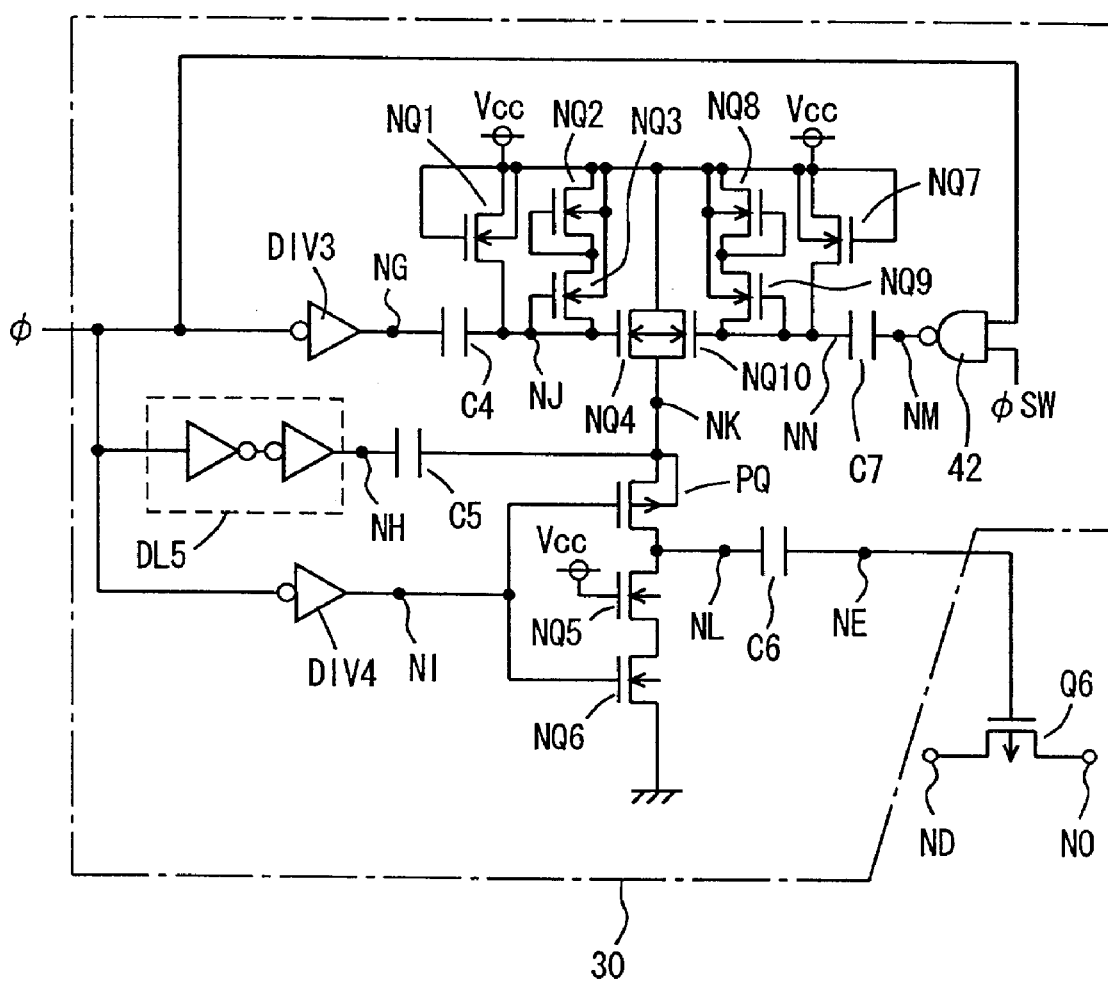
FIG. 6 is a circuit diagram of a modification 1 of the fourth embodiment of the present invention.

FIG. 6 is a circuit diagram showing a structure of a modification of the fourth embodiment of the present invention. In FIG. 6, a NAND circuit 42 is arranged instead of the EXNOR circuit 40 shown in FIG. 5. Other elements are the same as those shown in FIG. 5, and the same reference numerals are attached to the corresponding elements, and detailed explanation thereof is omitted.

In case of the circuit shown in FIG. 6, the voltage level of an output node NM of the NAND circuit 42 is fixed to an H level (power supply voltage Vcc) when the switch φSW is at an L level. Therefore, the node NN is also kept at the power supply voltage Vcc level. As a result, the MOS transistor NQ10 is constantly in an on-state to connect the external power node to the node NK. If the voltage level of the node NN is not less than Vcc+Vthn, the MOS transistor NQ10 transmits the power supply voltage Vcc to the node NK; where Vthn is the threshold voltage of the MOS transistor NQ10. Accordingly, even if the capacitor C5 performs charge pumping operation, the node NK is kept at the power supply voltage Vcc, so that the double boost section 30 operates as a single boost type circuit.

On the other hand, when the switch signal φSW is at an H level (power supply voltage Vcc level), the NAND circuit 42 operates as a delay inverter circuit and the voltage at the node NM changes in phase with the voltage at the node NG. The MOS transistor NQ10 repeatedly turns on/off in phase with the power source transistor NQ4. Therefore, the voltage level of the node NK rises to 2·Vcc by the charge pumping operation of the capacitor C5, so that this double boost section 30 generates a signal with an amplitude of 2·Vcc. As a result, by discharge operation of the MOS transistor Q5 shown in FIG. 15, the voltage of the node NE changes between the ground voltage and a negative voltage −2Vcc. Therefore, a double boost type substrate bias circuit is implemented.

[Modification 2]

FIG. 7 is a circuit diagram showing a structure of a modification 2 of the fourth embodiment of the present invention. In the double boost section 30 in FIG. 7, a selector 44 that receives a clock signal φ and the output signal of the inverter circuit 45 that receives the clock signal φ is arranged instead of the EXNOR circuit shown in FIG. 5. Other elements are the same as those shown in FIG. 5. When the switch signal φSW is at an L level and indicates a single boost type, the selector 44 selects the clock signal φ. In this case, the node NG and the node NM change in anti-phase with each other, so that the MOS transistor NQ4 and NQ10 turn on complementarily to each other. As a result, the node NK is constantly connected to the power node. Therefore, a signal with an amplitude of Vcc is generated at the node NE.

On the other hand, when the switch signal φSW is at an H level and indicates a double boost type, the selector 44 selects the output signal of the inverter circuit 45. In this case, the nodes NG and NM change in phase, so that the MOS transistors NQ4 and NQ10 turn on/off in phase.

Accordingly, a voltage of 2·Vcc at maximum is generated at the node NK by the charge pumping operation of the capacitor C5. Thus, a signal with an amplitude of 2·Vcc is outputted from the node NE, so that this double boost section 30 operates as a double boost type circuit.

As described above, according to the fourth embodiment of the present invention, the amplitude of the signal generated in the double boost section is changed in accordance with the switch signal, and it becomes possible to reduce the circuit occupation area and the chip area, to improve the chip yield. The same advantages provided by the first to third embodiments can be obtained also.

Fifth Embodiment

Figure 8:
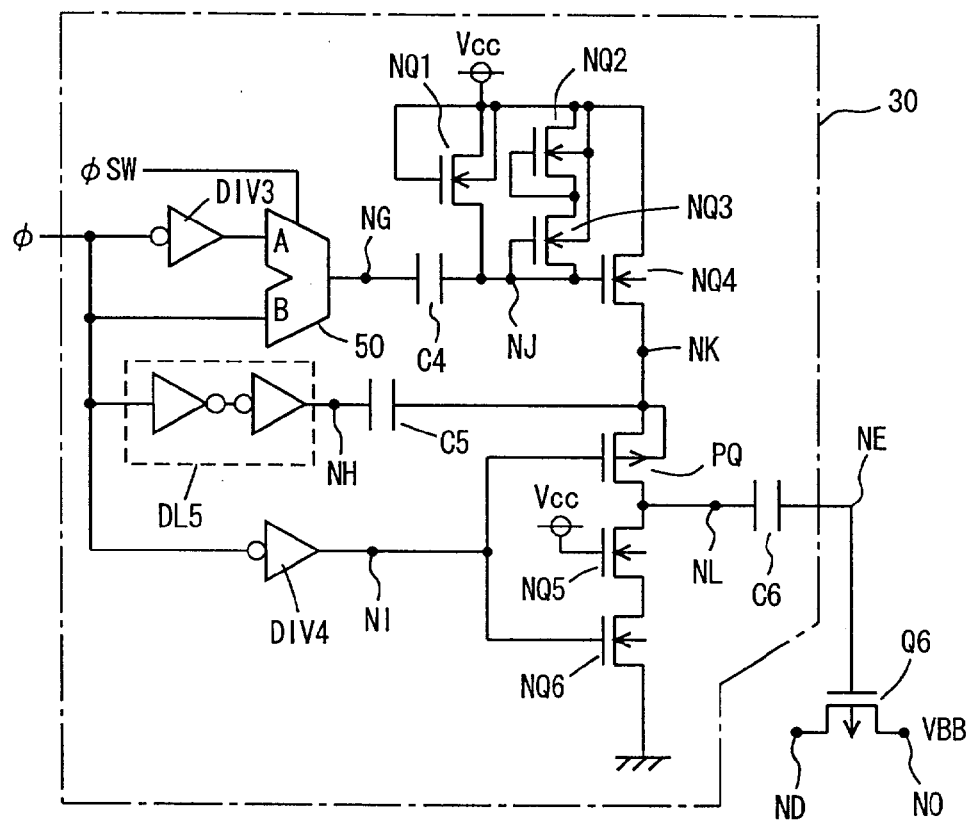
FIG. 8 is a circuit diagram of a main part of a substrate bias circuit according to a fifth embodiment of the present invention.

FIG. 8 is a circuit diagram showing a structure of a main part of a 25 substrate bias circuit according to the fifth embodiment of the present invention. FIG. 8 shows a double boost section 30 of a double boost type substrate bias circuit. In FIG. 8, the double boost section 30 includes a selector 50 that selects either of the output signal of the inverter circuit DIV3 and a clock signal φ in accordance with the switch signal φSW to 30 supply the selected signal to the capacitor C4. Other elements are the same as those shown in FIG. 17, and the same reference numerals are allotted to the corresponding elements, and detailed explanation thereof is omitted.

When the switch signal φSW is at an H level and indicates double boost operation, the selector 50 selects the output signal of the delay inverter circuit DIV3 that is applied to an input A thereof. In this case, the same double boost operation as performed by the circuit shown in FIG. 17 is implemented since the output signal of the delay inverter circuit DIV3 is applied to the capacitor C4.

Figure 9:
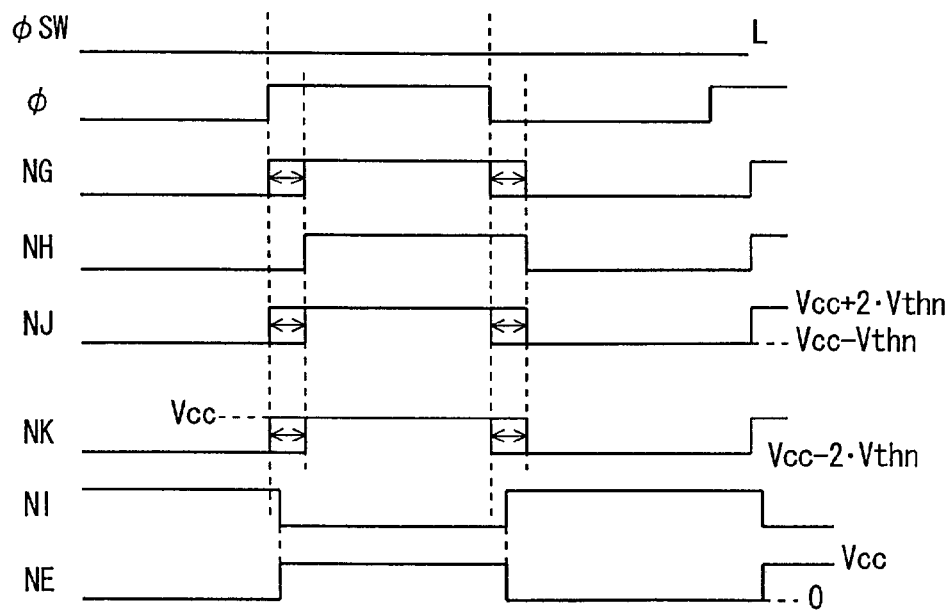
FIG. 9 is a waveform diagram representing the operation of the circuit shown in FIG. 8.

On the other hand, when the switch signal φSW is set to an L level to designate a single boost mode, the selector 50 selects the clock signal φ applied to its input B. Now, the description will be made of operation in this single boost mode, referring to a waveform diagram shown in FIG. 9.

When the clock signal φ rises from an L level to an H level, the voltage level of the node NG rises to an H level. In this case, the voltage level of the node NG changes, at an appropriate timing within time period shown by a bidirectional arrow shown in FIG. 9, by delay time of a not-shown buffer circuit arranged at the preceding stage of the input B of the selector 50.

When the voltage level of this node NG rises to the power supply voltage Vcc level, the voltage level of the node NJ rises by the capacitor C4. At the time of the rise in voltage level, the node NJ is kept at a voltage level of Vcc+2·Vthn by clamping operation of the MOS transistors NQ3 and NQ2. When the voltage level of the node NJ rises, the MOS transistor NQ4 turns on to connect the node NK to the external power node.

Even if, next, the output signal of the delay circuit DL5 rises to an H level in this state and charges are supplied to the node NK through the capacitor C5, this node NK is connected to the external power node and therefore, the voltage level of the node NK rises only to the power supply voltage Vcc level.

Next, when the output signal of the inverter DIV4 falls to an L level, the MOS transistor PQ turns on and the power supply voltage Vcc on the node NK is transmitted to the node NL. As a result, the voltage level of the node NL rises from the ground voltage level to the power supply voltage Vcc level. In accordance with the rise in the voltage of the node NL, the voltage level of the node NE rises by Vcc to attain the ground voltage level.

When the clock signal φ falls to an L level, the voltage level of the node NG falls. Responsively, the voltage level of the node NJ drops. In this case, the voltage level of the node NJ is clamped on a voltage level of Vcc−Vthn by the MOS transistor NQ1, and the MOS transistor NQ4 turns off. Next or simultaneously, the output signal of the delay circuit DL5 falls to an L level so that the voltage level of the node NK drops by the capacitor C5. In the case that the voltage level of the node NK drops, the voltage level of the node NJ is Vcc−Vthn and the MOS transistor NQ4 is in an on-state to supply charges to the node NK. In this case, therefore, the voltage level of the node NK drops only to a voltage level of Vcc−2·Vthn. At the time of the drop in the voltage level of the node NK, the voltage level of the node NI is at an H level and the MOS transistor PQ is in an off-state. MOS transistor NQ6 is in an on-state and therefore the node NL drops to the ground voltage level. As a result, the voltage level of the node NE drops by Vcc to change to a negative voltage −Vcc. Therefore, a signal with only an amplitude Vcc, which changes between the ground voltage and the negative voltage −Vcc, is applied to the node NE.

As for the timing of the change in the voltage of the node NG, the MOS transistor NQ4 should be in an on-state when the voltage level of the node NH rises, and the MOS transistor NQ4 should be in an off-state when the voltage level of the node NH drops.

Therefore, in the circuit shown in FIG. 8, the double boost section can be operated in either of the double boost operation mode and a single boost operation mode. Thus, a single substrate bias circuit can be operated as a double boost type substrate bias circuit and a single boost type substrate bias circuit. Therefore, the same advantages as obtained by the first to fourth embodiments can be achieved.

Sixth Embodiment

Figure 10:
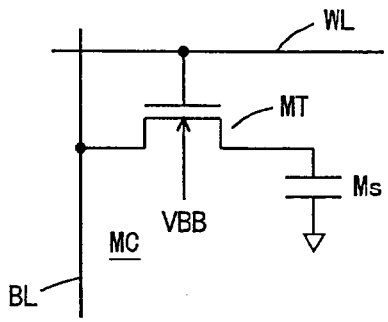
FIG. 10 is a circuit diagram showing an example of a portion that receives a substrate bias voltage.

FIG. 10 is a diagram showing an example of a circuit using substrate bias voltage VBB. In FIG. 10, this semiconductor device is a dynamic semiconductor memory device in which a memory cell MC includes a capacitor Ms for storing data, and an N channel MOS transistor MT for connecting a memory cell capacitor Ms to a bit line BL (or/BL) in response to a signal on a word line WL. Bias voltage VBB is applied to the back gate (substrate region) of this MOS transistor MT to stabilize the threshold voltage of the memory cell transistor and to reduce the junction capacitance thereof. Thus, it is possible to implement a memory cell that operates stably. As a circuit for generating this substrate bias voltage VBB, any one of the substrate bias circuits of the first to fifth embodiments can be used to implement a semiconductor memory device having a small occupation area.

[Modification]

Figure 11:
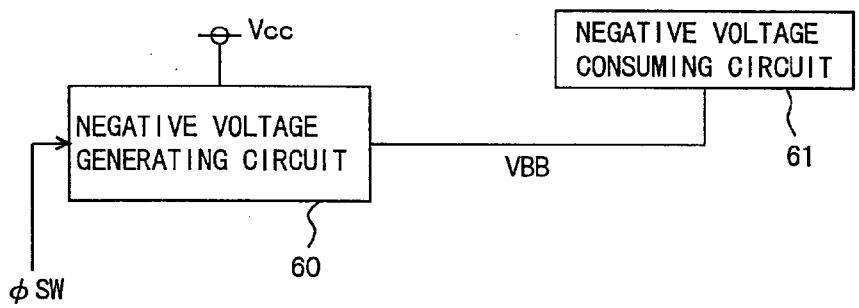
FIG. 11 is a block diagram showing a structure of a semiconductor device according to a modification of a sixth embodiment of the present invention.

FIG. 11 is a block diagram showing a main part of a semiconductor device according to a modification of the sixth embodiment of the present invention. In FIG. 11, the semiconductor device includes a negative voltage generating circuit 60 that receives external power supply voltage Vcc as operation power supply voltage to generate negative voltage VBB through charge pumping operation, and a negative voltage consuming circuit 61 that consumes the negative voltage VBB from the negative voltage generating circuit. This negative voltage consuming circuit 61 includes a word line driving circuit, for example, if non-selected word lines are driven to a negative voltage level to reduce leakage current of memory cell transistors in a semiconductor memory device.

In this negative voltage generating circuit 60, its internal operation mode is switched between a single boost mode and a double boost mode in accordance with switch signal φSW. The negative voltage VBB is efficiently generated in accordance with the power supply voltage Vcc so that the negative voltage consuming circuit 61 can be stably operated.

Figure 12A:
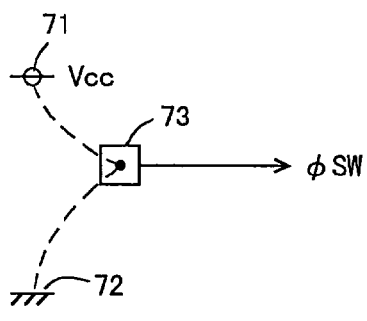
FIGS. 12A–12D are circuit diagrams each showing a portion which generates a switch signal.

Each of FIGS. 12A–12D is a diagram showing a circuit for generating the switch signal φSW. In FIG. 12A, a bonding pad 73 is selectively connected to a power source pin 71 or a grounding pin 72 through a bonding wire to set the switch signal φSW to an H level or an L level.

Figure 12B:
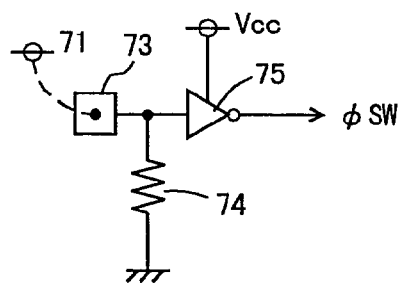

In FIG. 12B, a resistor element 74 having a high resistance is connected between a pad 73 and a ground node. An inverter circuit 75 that receives the signal of this pad is arranged to generate the switch signal φSW. In the circuit shown in FIG. 12B, the switch signal φSW attains an L level when the pad 73 is connected to the power supply pin 71. As a result, the single boost mode is designated. On the other hand, when this pad is left open, the voltage level of the pad 73 attains the ground level by the resistor element 74 having a high resistance. As a result, the switch signal φSW attains an H level to designate the double boost mode.

Figure 12C:
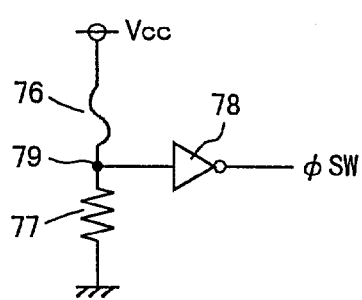

In the circuit shown in FIG. 12C, a fuse element 76 and a resistor element 77 having a high resistance are connected in series between a power node and a ground node. The inverter circuit 78 receives the signal of a junction node 79 between this fuse element 76 and the resistor element 77, to generate the switch signal φSW. The fuse element 76 can be blown off by an energy beam such as a laser beam. When the fuse element 76 is blown off, the node 79 attains the ground voltage level so that the switch signal φSW attains an H level. Thus, the double boost mode is designated. On the other hand, when the fuse element 76 is not blown off, the node 79 is at the power supply voltage Vcc so that the switch signal φ SW is at an L level. Thus, the single boost mode is designated.

In the circuits shown in FIGS. 12A–12C, the voltage level of the switch signal φSW is fixed after the device is assembled into a package. Therefore, when it is required to set the logic level of the switch signal φSW to the single boost mode forcibly in a burn-in test or the like after packaging, the switch signal φSW is forcibly set to an L level by other circuit element in accordance with a burn-in instructing signal instructing the burn-in test mode. In this way, the power supply voltage is made high and negative voltage VBB is generated so that the internal circuit can be operated in an accelerated test, such as a burn-in test, after packaging. In the burn-in test of the negative voltage generating circuit itself, the substrate bias circuit is operated in the single boost mode, or in the double boost mode. This is decided dependently on the accelerated voltage level of the power supply voltage.

Figure 12D:
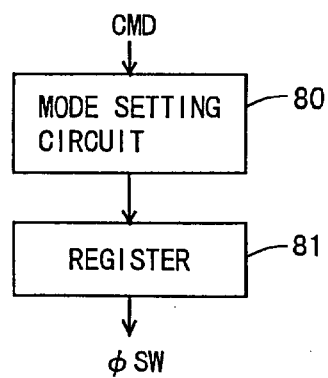

In the circuit shown in FIG. 12D, data for designating a single boost mode or a double boost mode is stored in a register 81 by a mode setting circuit 80 that receives an external command CMD. The switch signal φSW is set in accordance with the signal stored in this register 81. In this register 81, data for designating the single boost mode is stored as a default value. When the power supply voltage is low, the mode setting command CMD is applied to set the signal from a predetermined pin terminal into the register 81, and the switch signal φSW is set to an H level. In this way, the logic level of the switch signal φSW can be easily switched in accordance with an external signal even after packaging.

In this sixth embodiment, the switch signal φSW can easily be generated with a simple circuit structure, and the substrate bias circuit can be operated in single boost and double boost modes. The voltage level of the switch signal φSW may be set by mask interconnection.

Seventh Embodiment

Figure 13:
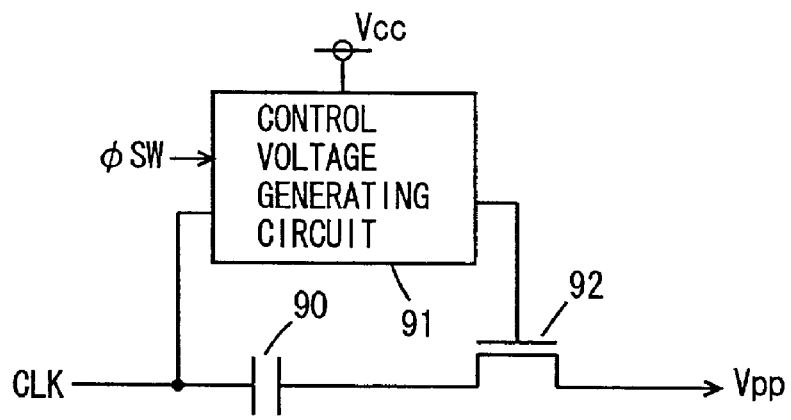
FIG. 13 is a circuit diagram of an internal voltage generating circuit according to a seventh embodiment of the present invention.
Figure 14:
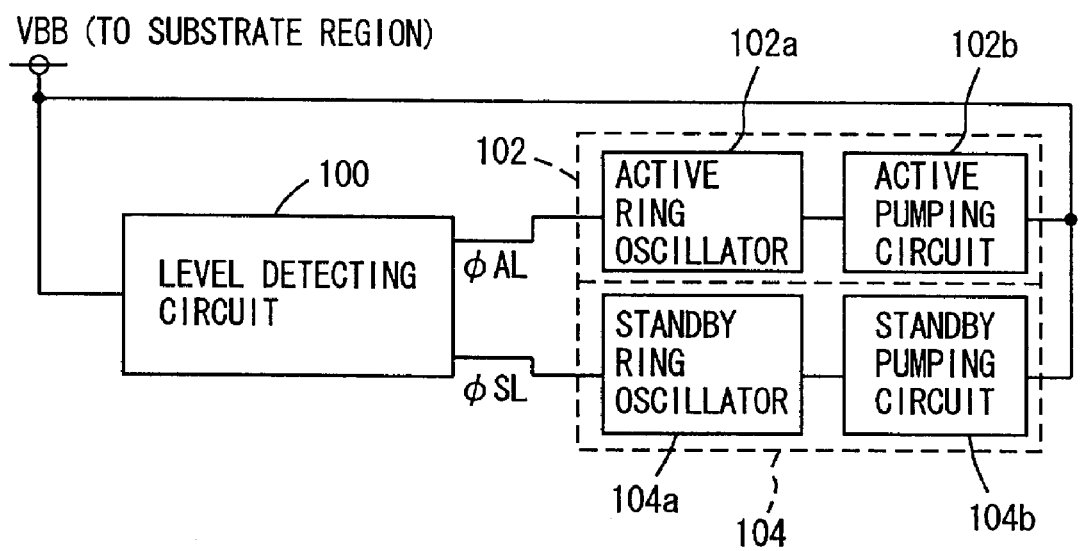
FIG. 14 is a block diagram showing a structure of a conventional substrate bias circuit.

FIG. 13 is a circuit diagram showing a structure of a semiconductor device according to the seventh embodiment of the present invention. FIG. 13 shows a high-voltage generating circuit for generating Vpp that is higher than the power supply voltage Vcc. In FIG. 13, the high-voltage generating circuit includes a capacitor 90 that performs charge pumping operation in accordance with a clock signal CLK; a control voltage generating circuit 91 that generates a control voltage from external power supply voltage Vcc in accordance with the clock signal CLK and switch signal φ SW; and a charge transferring MOS transistor 92 having a gate coupled to receive the control voltage from this control voltage generating circuit 91 to transfer charges of the capacitor 90 to an output node to generate the high voltage Vpp. This charge transferring MOS transistor 92 is shown being formed of an N channel MOS transistor. This charge transferring MOS transistor 92 may be composed of a P channel MOS transistor.

The control voltage generating circuit 91 changes the amplitude of the control voltage applied to the MOS transistor 92 in accordance with the logic level of the switch signal φSW. That is, when the switch signal φSW designates a single boost mode, the control voltage with an amplitude of Vcc is applied to the gate of the MOS transistor 92. On the other hand, when the switch signal φSW designates a double boost mode, the control voltage with an amplitude of 2·Vcc is applied to the gate of the MOS transistor 92.

The high-voltage Vpp is used, for example, to drive a selected word line into a selection state in a semiconductor device. In the case of the so-called "shared sense amplifier" in a semiconductor device (DRAM), the high-voltage Vpp is used to connect a bit line of this selected memory block and the sense amplifier and generate a bit line isolation signal for isolating the bit line of the non-selected memory block paired with the selected memory block and the sense amplifier.

Therefore, by changing the amplitude of the control voltage in accordance with the voltage level of the power supply voltage Vcc in the circuit generating such high-voltage Vpp, it is also possible to implement a high-voltage generating circuit for supplying charges effectively dependently on the voltage level of the power supply voltage and ensure the reliability of the high-voltage generating circuit.

As the control voltage generating circuit 21, any one of the first to third embodiments may be used. Alternatively, the following may be used: a high-voltage generating circuit in a single boost mode and a high-voltage generating circuit in a double boost type may. be separately arranged, and either of them is selectively activated in accordance with the switch signal φSW.

According to the seventh embodiment of the present invention, in a high-voltage generating circuit, the amplitude of control voltage is switched by the switch signal. Thus, it is possible to accelerate a power supply voltage level necessary in a test of the whole of the semiconductor device, ensure the reliability of the whole of the device, and improve the yield.

Even if the used power supply voltage is changed, it is possible to cope with the change by a single chip, and improve design efficiency.

Eighth Embodiment

In the circuits shown FIGS. 4–8, the amplitude of the gate voltage of the charge transferring MOS transistor Q6 is switched between Vcc and 2·Vcc. However, the structure of the delay circuit DL3 and the charge pumping capacitor Cl shown in FIG. 15 may be replaced by each of the structures shown in FIGS. 4–8. More specifically, by replacing the node NA in FIG. 15 by the node NL in each of FIGS. 4–8 and replacing the charge pumping capacitor Cl in FIG. 15 by the capacitor C6 in each of FIGS. 4–8, it is possible to switch the amplitude of the node NA shown in FIG. 15 between Vcc and 2·Vcc, change the amount of charges that the charge transferring MOS transistor Q6 can transfer by one time transfer operation, and implement charge pumping circuits having different charge driving capability with a single circuit structure.

In this case, by combining the structure for switching the amplitude of the voltage transmitted by the charge pumping capacitor with the structure for switching the amplitude of the gate voltage of the charge transferring MOS transistor Q6, it is possible to be adaptable to different power supply voltages by a single circuit structure, and to switch its charge supply capability under the same power supply voltage condition.

As described above, according to the present invention, the operation mode or the circuit structure of an internal voltage generating circuit is switched in accordance with the voltage level of power supply voltage. It is therefore possible to operate the internal voltage generating circuit as an optimal structure adapted to the voltage level of the power supply voltage and implement a semiconductor device superior in design efficiency and high in reliability.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device including:
    first internal voltage generating circuitry having a first operation mode, for generating an internal voltage of a predetermined voltage level at an output node;
    second internal voltage generating circuitry, having a second operation mode different from said first operation mode, for generating an internal voltage of the predetermined voltage level at said output node; and
    selection circuitry, responsive to a logic level of a switch signal which is different from the internal voltage, for selectively enabling either one of the first and second internal voltage generating circuitry.

2. The semiconductor device according to claim 1, wherein said first internal voltage generating circuitry and said internal voltage generating circuitry are separately arranged, and
    said selection circuitry comprises a circuit for generating a signal for alternatively activating either one of said first internal voltage generating circuitry and said second internal voltage generating circuitry in response to said switch signal.

3. The semiconductor device according to claim 1, wherein said first internal voltage generating circuitry includes a first oscillation circuit for performing an oscillation in a predetermined cycle, when activated, to generate an oscillation signal; and a charge pumping circuit for performing charge pumping operation in accordance with the oscillation signal from said first oscillation circuit to generate said internal voltage, and
    said second internal voltage generating circuitry includes a second oscillation circuit for performing an oscillation in a predetermined cycle, when activated, to generate an oscillation signal; and a second charge pumping circuit for performing charge pumping operation in accordance with the oscillation signal from said second oscillation circuit to generate said internal voltage, and
    either one of said first oscillation circuit and said second oscillation circuit is selectively activated in response to an output signal of said selection circuitry.

4. The semiconductor device according to claim 1, further comprising an oscillation circuit for performing an oscillation in a predetermined cycle when activated,
    wherein said first internal voltage generating circuitry includes a first charge pumping circuit for performing charge pumping operation in accordance with the oscillation signal from said oscillation circuit to generate said internal voltage, and
    said second internal voltage generating circuitry includes a second charge pumping circuit different in circuit structure from said first charge pumping circuit, for performing charge pumping operation in accordance with the oscillation signal from said oscillation circuit to generate said internal voltage, and
    said selection circuitry comprises a circuit for applying the oscillation signal from said oscillation circuit selectively to either one of said first charge pumping circuit and said second charge pumping circuit in response to said switch signal.

5. A semiconductor device comprising:
    first internal voltage generating circuitry having a first operation mode, for generating an internal voltage of a predetermined voltage level; and
    second internal voltage generating circuitry, having a second operation mode different from said first operation mode, for generating an internal voltage of the predetermined voltage level, one of said first internal voltage generating circuitry and said second internal voltage generating circuitry selectively set operable, wherein said first internal voltage generating circuitry shares components with said second internal voltage generating circuitry, and
    a gate circuit for operating said second internal voltage generating circuitry as said first internal voltage generating circuitry in response to a switch signal.

6. The semiconductor device according to claim 5, wherein said second internal voltage generating circuitry includes a charge pumping capacitor for performing charge pumping operation in response to a clock signal, a transfer gate for transferring charges from said charge pumping capacitor to an output node, and a voltage control circuit for setting a voltage of a control gate of said transfer gate in response to said clock signal, and said voltage control circuit changes an amplitude of the voltage applied to the control gate of said transfer gate in response to an output signal from said gate circuit.

7. The semiconductor device according to claim 6, wherein said voltage control circuit includes a first circuit for outputting a voltage of an internal power node in response to said clock signal, and a power source control circuit for adjusting a voltage of level of said internal power node in response to said clock signal, and said power source control circuit sets the voltage of said internal power node to a first voltage level in response to a first logic level of the output signal of said gate circuit, and sets a maximum level of the voltage of said internal power node to a voltage level higher than said first voltage level in response to a second logic level of the output signal of said gate circuit.

8. The semiconductor device according to claim 7, wherein said power source control circuit transfers a voltage changing in accordance with said clock signal to said internal power node in response to said second logic level of the output signal of said gate circuit.

9. The semiconductor device according to claim 6, wherein said voltage control circuit includes a first power supply circuit for connecting an internal power node selectively to an external power node in response to said clock signal, a second power supply circuit operating in a common phase with said first power supply circuit in response to a first logic level of a switch signal and operating complementarily with said first power supply circuit in response to a second logic level of said switch signal to connect said external power node to said internal power node, and a voltage applying circuit receiving the voltage of said internal power node as one operation power supply voltage to apply a voltage to the control gate of said transfer gate in response to said clock signal, and said first voltage generating circuitry comprises said voltage applying circuit.

10. The semiconductor device according to claim 9, wherein said gate circuit includes a logic gate for buffering said clock signal for application to said second power supply circuit in response to said first logic level of said switch signal, and inverting said clock signal for application to said second power supply circuit in response to said second logic level of said switch signal.

11. The semiconductor device according to claim 9, wherein said gate circuit includes a selection circuit for selecting either one of said clock signal and the inverted signal of said clock signal for application to said second power supply circuit in response to said switch signal.

12. The semiconductor device according to claim 6, wherein said voltage control circuit includes a first power supply circuit for connecting an internal power node selectively to an external power node in response to a clock signal, a circuit for supplying a power supply voltage to said internal power node in response to said clock signal, a voltage applying circuit receiving the voltage of said internal power node as one operation power supply voltage, for applying a voltage to said transfer gate in response to said clock signal, and a selection circuit for applying either one of said clock signal and an inverted signal of said clock signal in response to a switch signal to said first power supply circuit, and said first internal voltage generating circuitry comprises said voltage applying circuit.

13. A semiconductor device including:

internal voltage generation circuitry for applying a control signal having a first amplitude to a control gate of a transfer gate for transferring charges to an output node to generate an internal voltage at said output node, a maximum absolute value of said internal voltage being defined by the amplitude of said control signal; and circuitry for changing the amplitude of said control signal of said internal voltage generation circuitry to a second amplitude different from said first amplitude in response to a switch signal.

14. A semiconductor device including:

internal voltage generating circuitry for applying a control signal to a control gate of a transfer gate for transferring charges to an output node to generate an internal voltage at said output node, a maximum absolute value of said internal voltage being defined by an amplitude of said control signal; and circuitry for setting the amplitude of said control signal of said internal voltage generating circuitry to either one of a first amplitude and a second amplitude smaller than said first amplitude in response to a switch signal.

15. A semiconductor device comprising:

first internal voltage generating circuitry having a first operation mode, for generating an internal voltage of a predetermined voltage level; and second internal voltage generating circuitry, having a second operation mode different from said first operation mode, for generating an internal voltage of the predetermined voltage level, one of said first internal voltage generating circuitry and said second internal voltage generating circuitry selectively set operable, wherein said first internal voltage generating circuitry is a single boost type substrate bias generating circuit for generating a bias voltage applied to a substrate region through charge pumping operation;

said second internal voltage generating circuitry comprises a double boost type substrate bias generating circuit for generating the bias voltage applied to said substrate region through charge pumping operation, said second internal voltage generating circuitry being formed on a common semiconductor chip with said single boost type substrate bias generating circuit; and in a practical use, either one of said single boost type substrate bias generating circuit and said double boost type substrate bias generating circuit is used.

16. The semiconductor device according to claim 13, wherein said control signal is a repetition signal having a predetermined cycle and applied repetitively.

17. The semiconductor device according to claim 13, wherein said transfer gate transfers the charges generated through charge pumping operation to said output node in response to said control signal.

18. The semiconductor device according to claim 14, wherein said control signal is a repetition signal having a predetermined cycle and applied repetitively.

19. The semiconductor device according to claim 14, wherein said transfer gate transfers the charges generated through charge pumping operation to said output node in response to said control signal.

20. The semiconductor device according to claim 1, further comprising voltage detection circuitry for detecting a voltage level of the internal voltage, wherein each of said first internal voltage circuitry and said second internal voltage generating circuitry includes a plurality of voltage generation circuits each for generating the internal voltage onto said output node, and the first and second internal voltage generating circuitry each activate selectively the plurality of voltage generation circuits in accordance with an output signal of the voltage detection circuitry when enabled by said selection circuitry.

* * * * *